(12) United States Patent
Mekhanik et al.

(10) Patent No.: US 11,210,031 B1
(45) Date of Patent: Dec. 28, 2021

(54) THERMAL REGION TAGS AND THERMAL REGION OUTLIER DETECTION

(71) Applicant: Western Digital Technologies, Inc., San Jose, CA (US)

(72) Inventors: Evgeny Mekhanik, Rehovot (IL); Tomer Tzvi Eliash, Sunnyvale, CA (US); Barak Goldberg, Kfar Saba (IL)

(73) Assignee: Western Digital Technologies, Inc., San Jose, CA (US)

( * ) Notice: Subject to any disclaimer, the term of this patent is extended or adjusted under 35 U.S.C. 154(b) by 61 days.

(21) Appl. No.: 16/923,849

(22) Filed: Jul. 8, 2020

(51) Int. Cl.
 *G06F 3/06* (2006.01)
 *G01K 3/08* (2006.01)
 *G11C 29/38* (2006.01)

(52) U.S. Cl.
 CPC ............ *G06F 3/0659* (2013.01); *G01K 3/08* (2013.01); *G06F 3/064* (2013.01); *G06F 3/0619* (2013.01); *G06F 3/0653* (2013.01); *G06F 3/0679* (2013.01); *G11C 29/38* (2013.01)

(58) Field of Classification Search
 CPC .... G06F 11/1048; G06F 3/0634; G06F 3/064; G06F 3/0653; G06F 3/0659; G06F 3/0679
 See application file for complete search history.

(56) References Cited

U.S. PATENT DOCUMENTS

| 9,165,670 | B2 | 10/2015 | Mekhanik et al. |
| 9,595,347 | B2 | 3/2017 | Zhao et al. |
| 9,996,281 | B2 | 6/2018 | Sharon et al. |
| 10,379,739 | B1 | 8/2019 | Bazarsky et al. |
| 10,395,728 | B2 | 8/2019 | Wu |
| 10,475,523 | B2 | 11/2019 | Sharon et al. |
| 2017/0255403 | A1* | 9/2017 | Sharon ............... G11C 11/5642 |
| 2017/0262198 | A1* | 9/2017 | Nakata ................. G06F 3/0634 |
| 2019/0012226 | A1* | 1/2019 | Muchherla .......... G06F 11/1048 |
| 2019/0348108 | A1* | 11/2019 | Chang ................ G06F 13/1636 |
| 2020/0333976 | A1* | 10/2020 | Cariello ............. G06F 11/3034 |

* cited by examiner

*Primary Examiner* — Shelly A Chase
(74) *Attorney, Agent, or Firm* — Patterson & Sheridan, LLP; Steven H. Versteeg

(57) ABSTRACT

A method, device, and system for improving read performance in frequently changing device temperature conditions through detecting thermal region tags and thermal region outliers in a memory device. A plurality of thermal regions may be configured for the memory device. A first temperature may be measured corresponding to opening a storage block of the memory device for programming. A second temperature may then be measured corresponding to closing the storage block for programming. A range between the first temperature and the second temperature may be determined. The range may span N≥2 of the thermal regions. Finally, the storage block may be assigned to a thermal region that includes the second temperature, on condition that N satisfies a threshold.

20 Claims, 12 Drawing Sheets

THERMAL REGION TAGS AND THERMAL REGION OUTLIER DETECTION

BACKGROUND

During the operation of electronic memory storage devices, it is desirable to reduce the resource overhead for managing frequent temperature changes. For example, it is desirable to reduce data reclamation operations each time the system experiences a cross-temperature event. "Cross-temperature event" refers to an event determined by a difference in temperature between either opening and closing a block, or closing a first block and closing a second block. Cross-temperature events may become especially problematic under certain operating conditions, such as:
1. Temperature change of high amplitude and high or low frequency.
2. Temperature changes on small (relative to the overall memory capacity) numbers of programmed memory blocks storing frequently read data.
3. Temperature changes across frequent power cycles, or software or hardware device resets.

Previous approaches mark programmed blocks or pages for refresh according to the write (programming) temperature for the data in those blocks or pages. A temperature range table for write and read operations is maintained, and data is refreshed in order to reduce the bit error rate (BER) when the write temperature is above or below pre-determined thresholds. Programmed blocks are closed prematurely (before becoming full of programmed data) each time a cross-temperature event is detected. In the presence of high frequency temperature variations this may result in the storage system saturating its management resources, causing an overall increase in read/write latency.

SUMMARY

This disclosure relates to a method for improving read performance in frequently changing device temperature conditions through detecting thermal region tags and thermal region outliers. Thermal regions may be configured for a memory device. A first temperature may be measured corresponding to opening a storage block of the memory device for programming, and a second temperature may then be measured corresponding to closing the storage block for programming. A range between the first temperature and the second temperature may be determined spanning N≥2 of the thermal regions. The storage block may be assigned to the thermal region including the second temperature, on condition that N satisfies a threshold.

This disclosure further relates to a device for improving read performance in frequently changing device temperature conditions through detecting thermal region tags and thermal region outliers. The device may include a non-volatile memory array, a controller, and logic configured to implement the disclosed solution. The logic may measure a first temperature corresponding to opening a storage block of the non-volatile storage array for programming, where the first temperature is located within a first of a plurality of pre-configured thermal regions. "Pre-configured thermal regions" refers to settings made in a memory device prior to programming a block and associated with a range of device temperatures. The number and extent of these regions may be tailored to specific types of memory and/or memory devices.

The logic may measure a second temperature corresponding to closing the storage block for programming, where the second temperature is located within a second of the plurality of pre-configured thermal regions in an N-hop neighborhood of the first of the pre-configured thermal regions, where N≥1. "N-hop neighborhood" refers to a number of adjacent thermal regions configured either on one or both sides of a particular thermal region. For example, an N-hop neighborhood for a region R could include only the N thermal regions of lower temperatures adjacent to R, or could include N thermal regions adjacent and above R and N thermal regions adjacent and below R. Unless otherwise indicated, the term N-hop neighborhood should be understood to include one or both of these options. The logic may then assign the storage block to the second of the pre-configured thermal regions. The plurality of pre-configured thermal regions may be configured such that memory read parameters for thermal regions in the N-hop neighborhood are compatible.

This disclosure additionally relates to a system for improving read performance in frequently changing device temperature conditions through detecting thermal region tags and thermal region outliers. The system includes a memory array and a controller. The controller may measure a first temperature when a block of the memory array is opened and measure a second temperature when the block is closed. The controller may assign the block a tag corresponding to one of a plurality of pre-configured thermal regions including the second temperature, on condition that a range between the first temperature and the second temperature spans 1≤N≤M contiguous thermal regions of the pre-configured thermal regions. Finally, the controller may relocate blocks including a same tag to be adjacent in the memory array.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
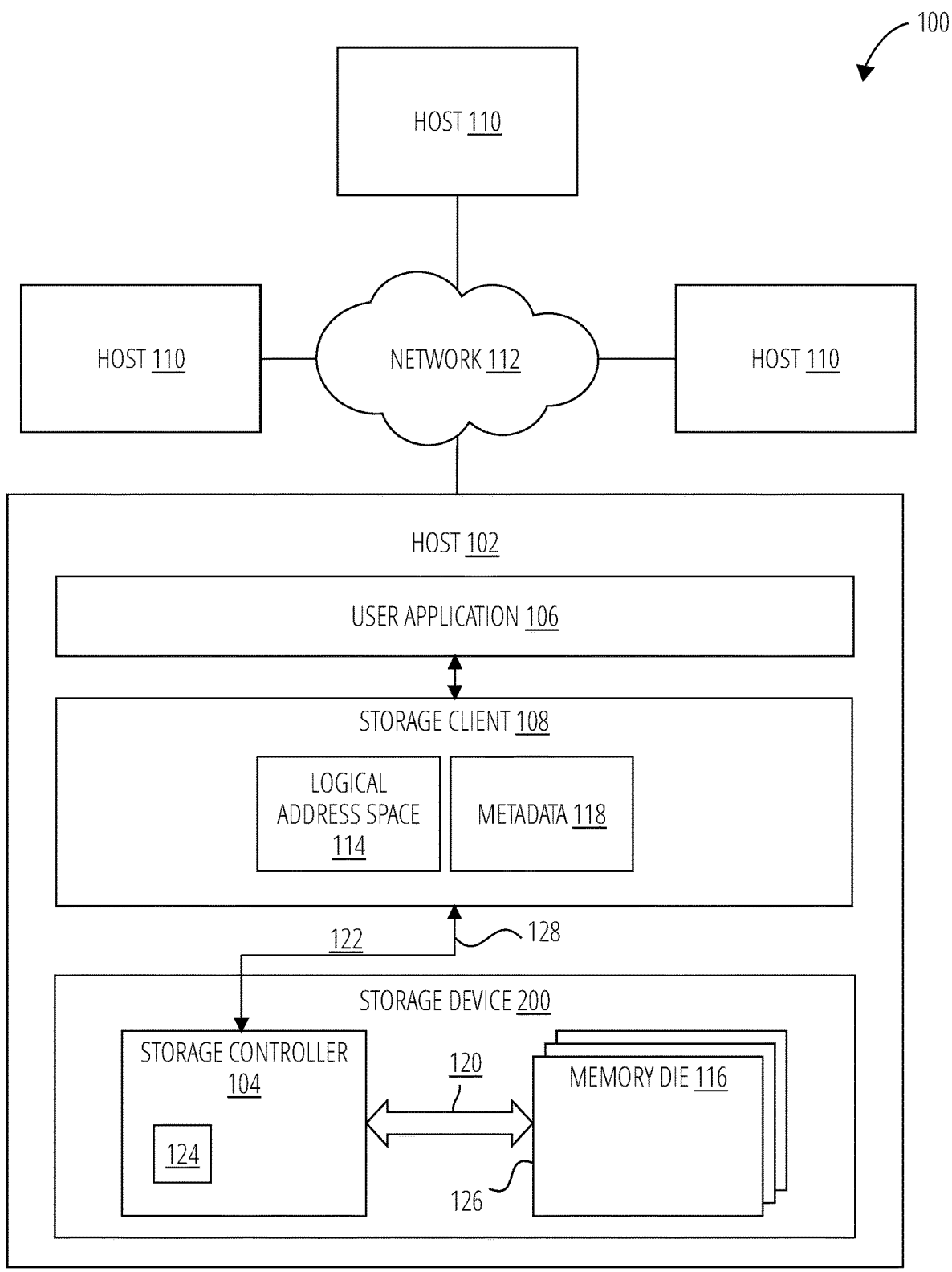
FIG. 1 is a block diagram depiction of a storage system 100 in accordance with one embodiment.

Modern electronic storage devices utilize single-level memory cells (SLC), multi-level memory cells (MLCs), tri-level memory cells (TLCs) and quad-level memory cells (QLCs) to store programmed data. These types of memory cells, especially TLCs and QLCs are sensitive to temperature variations that cross certain thresholds, referred to herein cross-temperature events. Cross-temperature events may have small or large amplitude and may occur with low or high frequency. Prior approaches associate a thermal region tag with open memory blocks and close all such blocks (perhaps prematurely, before the blocks are fully programmed) as a results of detecting a cross-temperature event. This may result for example in poor utilization of the storage capacity of memory devices and an increase in write amplification. It may also place stresses on memory management resources.

Described herein are embodiments of systems and techniques to manage cross-temperature events, and to adjust memory read parameters, in manners that may be more operationally efficient (e.g., consuming fewer machine resources, such as processor cycles and memory) than prior approaches. Write amplification and read performance may also be improved. Devices utilizing these techniques may adapt to changing temperature conditions faster and more efficiently than with prior approaches.

In one embodiment, blocks with common or similar read parameters are logically grouped using relational tables based on a thermal region in which the blocks were closed. Programmed blocks are related into groups based on thermal region tags assigned to the blocks when they are closed. Blocks are not closed prematurely (before being fully programmed). Techniques are also described to identify and relocate thermal outlier blocks. "Thermal outlier block" refers to a block identified as having experienced an extreme cross-temperature event.

In overview, a number of thermal region tags are maintained for programmed blocks. Blocks are assigned to a thermal region tag when block programming is completed (when the block is closed). Cross-temperature events are monitored for and detected. Blocks are marked as thermal outliers for priority relocation when a temperature variation spanning a number (e.g., more than two, and more generally, N) neighboring thermal regions is detected. "Priority relocation" refers to the prioritized evacuation of data from a block.

For example, a number of thermal region tags may be dynamically assigned to blocks corresponding to pre-configured programming temperature ranges that may be expected for a device over time. Each thermal region tag thus associate closed blocks with a temperature range. Each thermal region tag is assigned read parameters to be applied when reading blocks with that tag. The blocks are assigned a thermal region tag based on a temperature measured at a time the block is closed for programming. On condition that more than two thermal regions are crossed during programming of an open block, the block is marked as a thermal outlier. This may trigger a relocation of the block and association of the block with a special thermal region tag indicating its outlier status (e.g., to trigger more rigorous BER testing on the block). "Bit error rate" or BER refers to a measure of a number of bits in error of a total overall number of bits processed. In certain embodiments, a BER is calculated after an Error Correction Code (ECC) decoder has made one or more attempts to correct one or more bits in error.

Table 1 below depicts an exemplary association structure for thermal regions and thermal region tags.

TABLE 1

Thermal Region Tags

| Program Temperature, C | Thermal Region Id | Name | Notes |
|---|---|---|---|
| <−25 | 0 | Extra Cold | Abnormal Cold Mode for Mobile Products |
| −25...0 | 1 | Cold | |
| 0...+25 | 2 | Cold-Room | |
| +25...+50 | 3 | Room | |
| +50...+75 | 4 | Room-Hot | |
| +75...+95 | 5 | Hot | |
| >+95 | 6 | Extra Hot | Abnormal Hot Mode for Mobile Products |

At the time a block is read, a second temperature is measured. This temperature may be a temperature from the ambient environment of the memory device, or a temperature of a component of the memory device, such as a memory chip or memory die. Read parameters are obtained from the thermal region tag assigned to the block when it was closed for programming, and these read parameters are applied when reading the block.

The thermal regions may be managed with hysteresis to mitigate temperature measurement noise in environments where the temperature changes rapidly and/or frequently during programming of the block. A set of read parameters are associated with each thermal region. When an open block is closed it is assigned the read parameters of the thermal region corresponding to the block closure temperature, or associated to an outlier block thermal region if the range between a temperature measured when opening the block and temperature measured when closing the block satisfies a threshold (e.g., spanning more than N thermal regions). Hysteresis is inherent in this process, since cross-temperature events that occur between these two measurements do not result in premature closure of the block.

Thermal regions may in some embodiments be created dynamically, such that if a block is closed at a temperature not corresponding to an existing thermal region, a new thermal region for that temperature may be created as a result of closing the block.

Distinct from prior approaches, blocks are not necessarily closed in the event of a cross-temperature event. Rather the thermal region tag assigned to a block is determined by the temperature at the time of block closure. The number of managed and/or pre-configured thermal regions may vary by implementation and use case for the memory device.

Blocks for which programming is closed within the same thermal region are assigned the same thermal region tag (the thermal region tag of the thermal region that includes the close temperature). This means a block programmed across two (or possibly more) neighbor thermal regions will be assigned the same thermal region tag as a block programmed in just one thermal region, provided both blocks are closed in the same thermal region. However, blocks with an open temperature and close temperature range that spans more than N neighbor thermal regions (where N is configurable to be ≥1) may be treated as thermal outlier blocks. These thermal outlier blocks may be marked for priority relocation (meaning 'eviction' of the data in these blocks to other blocks that are not thermal outlier blocks).

Thus logical groups of blocks may be distinguished based on the thermal region tag assigned to the blocks. Block groups may be further distinguished by secondary stress effects. If additional stress events on the memory are detected, such as long power-down cycles or excessive operation at high temperatures (e.g., above 85° C.), blocks programmed after such events, even if closed within the thermal region of existing closed blocks, may not be assigned the same thermal region tag as those existing closed blocks. Instead, the blocks closed after the additional stress event may be assigned a thermal region tag indicative of their status as potentially being more unreliable. The thermal region tag assigned to such blocks could be the thermal region tag for the thermal region tag in which they were closed, but with an additional marker to indicate that they may be more unreliable than the blocks assigned the same thermal region tag, before the stress event. Or, such blocks may be identified with a thermal region tag associated with thermal outlier blocks.

If a test of such a memory block after a stress event indicates data retention errors in excess of a threshold level, the assignment of thermal region tags may be adjusted as described to account for the increased unreliability of the memory. For example, detection of an extreme cross-temperature event may trigger the memory device to schedule such a test and update of the read parameters associated with all thermal regions/thermal region tags. "Extreme cross-temperature event" refers to a cross-temperature event that, for a particular type of memory device and application of the device, is identified as something that may degrade reliability or performance of the memory device. This can include detecting the device temperature to be in a dangerously hot or cold state for any period of time, or a threshold period of time, or detecting an excessive range between a temperature at which a block is opened and a temperature at which a block is closed. The test/update for a particular thermal region tag may only occur when a block is closed in the associated thermal region subsequent to the extreme cross-temperature event. In this manner the read parameters are maintained and updated after an extreme cross-temperature event, at least for blocks closed after the extreme cross-temperature event. Depending on the implementation, some cross-temperature events may not trigger an update of the read parameters, depending on how the programmed memory blocks are organized or distributed, and other factors.

A plurality of thermal regions may be configured for a memory device. A first temperature may be measured corresponding to opening a storage block of the memory device for programming. A second temperature may then be measured corresponding to closing the storage block for programming. A range between the first temperature and the second temperature may be determined. The range may span $N \geq 2$ of the thermal region. The storage block may be assigned to the thermal region including the second temperature, on condition that N satisfies a threshold.

The storage block may be marked as a thermal outlier block if N does not satisfy the threshold. Marking the storage block as the thermal outlier block may trigger evacuation of data from the storage block. "Evacuation of data" refers to copying data from one block and programming the copied data into another block. Each of the pre-configured thermal regions may have a range of approximately 25° C. Read parameters to apply to storage blocks assigned to a particular thermal region may be applied particularly to blocks assigned to the particular thermal region. The thermal regions may be configured such that for at least a subset $M \geq 2$ of the thermal regions, the read parameters for any N adjacent thermal regions of the subset M are compatible, meaning that they may be used to read from blocks assigned to any thermal region of the adjacent set.

A device including a non-volatile memory array, a controller, and logic may configured to implement the disclosed techniques. The device logic may measure a first temperature corresponding to opening a storage block of the non-volatile storage array for programming, where the first temperature is located within a first of a plurality of pre-configured thermal regions. The device logic may also measure a second temperature corresponding to closing the storage block for programming, where the second temperature is located within a second of the plurality of pre-configured thermal regions in an N-hop neighborhood of the first of the pre-configured thermal regions ($N \geq 1$). The device logic may then assign the storage block to the second of the pre-configured thermal regions. The plurality of pre-configured thermal regions may be configured such that memory read parameters for thermal regions in the N-hop neighborhood are compatible.

The device logic further detect a cross-temperature event and update the read parameters for one or more of the pre-configured thermal regions as a result of the cross-temperature event. Updating the read parameters may be conditioned on the cross-temperature event being an extreme cross-temperature event. The device logic may test a BER for a storage block closed after the cross-temperature event, and distinguish the storage block closed after the cross-temperature event from a storage block closed before the cross-temperature event. The storage block closed after the cross-temperature event and the storage block closed before the cross-temperature event may be assigned to a same thermal region, but distinguished from one another. The BER test may be performed on condition that the storage block closed after the cross-temperature event is a first closed storage block after the cross-temperature event in a particular thermal region. To distinguishing the storage block closed after the cross-temperature event from the storage block closed before the cross-temperature event, a new thermal region tag may be created associated with the same thermal region assigned to the storage block closed before the cross-temperature event, but marked to invoke additional read verification on associated storage blocks.

The device logic may deactivate the thermal region tag of the block programmed before the cross-temperature event, such that storage blocks closed after the cross-temperature event cannot be assigned to the thermal region tag of the storage block closed before the cross-temperature event (but are instead to a thermal region tag marked for additional read verification, for example). The BER test and distinguishing may involve (a) applying read parameters assigned to the storage block closed before the cross-temperature event to read data from the storage block closed after the cross-temperature event, (b) comparing BERs for the storage block closed before the cross-temperature event and the storage block closed after the cross-temperature event, and (c) distinguishing the storage block closed after the cross-temperature event from the storage block closed before the cross-temperature event on condition that the comparing satisfies a threshold. Distinguishing the storage block closed after the cross-temperature event from the storage block closed before the cross-temperature event may be independent of a time interval of the cross-temperature event. For example, in some implementations, any detection of an extreme cross-temperature event, regardless of duration, may be sufficient to trigger the distinguishing process.

A system including a memory array and a controller may operate the controller to measure a first temperature when a block of the memory array is opened, measure a second temperature when the block is closed, and assign the block a thermal region tag corresponding to one of a plurality of pre-configured thermal regions including the second temperature. The assignment of the thermal region tag for the thermal region including the second temperature may be conditioned on a range between the first temperature and the second temperature spanning $1 \leq N \leq M$ contiguous thermal regions of the pre-configured thermal regions. If this condition is not met, the block may for example be assigned to a thermal region tag for a thermal outlier block. The controller may relocate blocks assigned to the same thermal region tags to be adjacent in the memory array.

As mentioned the controller may mark blocks for which the range between the first temperature and the second temperature spans more than M contiguous thermal regions as thermal outlier blocks. The controller may evacuate data from the thermal outlier blocks with elevated priority. The controller may detect an extreme cross-temperature event. The controller may distinguish blocks closed after the extreme cross-temperature event and assigned a particular thermal region tag from blocks closed before the extreme cross-temperature event having the particular thermal region tag, for example in the manners described previously. The controller may then relocate the blocks having the particular tag and closed after the extreme cross-temperature event to be adjacent in the memory array, distinct from the blocks having the particular tag and closed before the extreme cross-temperature event. The controller may distinguish the blocks closed before the extreme cross-temperature event from the blocks closed after the extreme cross-temperature event when a BER for a first of the blocks closed after the extreme cross-temperature event compares unfavorably to a BER for one of the blocks closed before the extreme cross-temperature event.

FIG. 1 is a schematic block diagram illustrating one embodiment of a storage system 100 that may utilize embodiments of the disclosed techniques for identifying a last-programmed memory page in one or more memory blocks. The storage system 100 includes a storage device 200, a storage controller 104, a memory die 116, a host 102, a user application 106, a storage client 108, a logical address space 114, a metadata 118, a flash translation layer 124, a data bus 122, a bus 120, at least one host 110, and a network 112.

"Storage client" refers to any hardware, software, firmware, or logic component or module configured to communicate with a storage device in order to use storage services. Examples of a storage client include, but are not limited to, operating systems, file systems, database applications, a database management system ("DBMS"), server applications, a server, a volume manager, kernel-level processes, user-level processes, applications, mobile applications, threads, processes, and the like.

"Hardware" refers to functional elements embodied as analog and/or digital circuitry. "Firmware" refers to logic embodied as processor-executable instructions stored on volatile memory media and/or non-volatile memory media. "Software" refers to logic implemented as processor-executable instructions in an electronic memory (e.g. read/write volatile memory media or non-volatile memory media). "Logic" refers to electronic memory circuits, non-transitory machine readable media, and/or circuitry which by way of its material and/or material-energy configuration includes control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories including software and thereby forming configurations of matter). "Volatile memory" refers to a shorthand name for volatile memory media. In certain embodiments, volatile memory refers to the volatile memory media and the logic, controllers, processor(s), state machine(s), and or other periphery circuits that manage the volatile memory media and provide access to the volatile memory media.

"Data block" refers to a smallest physical amount of storage space on physical storage media that is accessible, and/or addressable, using a storage command. The physical storage media may be volatile memory media, non-volatile memory media, persistent storage, non-volatile storage, flash storage media, hard disk drive, or the like. Certain conventional storage devices divide the physical storage media into volumes or logical partitions (also referred to as partitions). Each volume or logical partition may include a plurality of sectors. One or more sectors are organized into a block (also referred to as a data block). In certain storage systems, such as those interfacing with the Windows® operating systems, the data blocks are referred to as clusters. In other storage systems, such as those interfacing with UNIX, Linux, or similar operating systems, the data blocks are referred to simply as blocks. A data block or cluster represents a smallest physical amount of storage space on the storage media that is managed by a storage controller. A block storage device may associate n data blocks available for user data storage across the physical storage media with a logical block address (LBA), numbered from 0 to n. In certain block storage devices, the logical block addresses may range from 0 to n per volume or logical partition. In conventional block storage devices, a logical block address maps directly to one and only one data block. "User data" refers to data that a host directs a non-volatile storage device to store or record.

"Storage operation" refers to an operation performed on a memory cell in order to change, or obtain, the value of data represented by a state characteristic of the memory cell. Examples of storage operations include but are not limited to reading data from (or sensing a state of) a memory cell, writing (or programming) data to a memory cell, and/or erasing data stored in a memory cell.

"Storage command" refers to any command relating with a storage operation. Examples of storage commands include, but are not limited to, read commands, write commands, maintenance commands, diagnostic commands, test mode commands, countermeasure command, and any other command a storage controller may receive from a host or issue to another component, device, or system.

"Countermeasure" refers to a method, process, step or operation configured to mitigate a negative attribute, factor, or condition. It should be noted that in certain instances a viable countermeasure is to take no action with respect to an identified negative attribute, factor, or condition. While taking no action may be considered a passive activity, such a response to a negative attribute, factor, or condition is considered a countermeasure herein. In certain embodiments, a countermeasure is specific to a particular problem or indication of a problem. Examples of countermeasures, that may be used include actively changing a die temperature of erase blocks, relocating data of to another storage location, adjusting an alert threshold, managing one or more physical erase blocks using separate Cell Voltage Distribution (CVD) tables, and taking no action.

"Countermeasure command" refers to a storage command configured to implement a countermeasure to mitigate, or reverse, deterioration of a storage block and/or deteriorating storage block health.

"Characteristic" refers to any property, trait, quality, or attribute of an object or thing. Examples of characteristics include, but are not limited to, condition, readiness for use, unreadiness for use, size, weight, composition, feature set, and the like.

"Volatile memory media" refers to any hardware, device, component, element, or circuit configured to maintain an alterable physical characteristic used to represent a binary value of zero or one for which the alterable physical characteristic reverts to a default state that no longer represents the binary value when a primary power source is removed or unless a primary power source is used to refresh the represented binary value. Examples of volatile memory media include but are not limited to dynamic random-access memory (DRAM), static random-access memory (SRAM), double data rate random-access memory (DDR RAM) or other random-access solid-state memory. While the volatile memory media is referred to herein as "memory media," in various embodiments, the volatile memory media may more generally be referred to as volatile memory. In certain embodiments, data stored in volatile memory media is addressable at a byte level which means that the data in the volatile memory media is organized into bytes (8 bits) of data that each have a unique address, such as a logical address.

"Memory" refers to any hardware, circuit, component, module, logic, device, or apparatus configured, programmed, designed, arranged, or engineered to retain data. Certain types of memory require availability of a constant power source to store and retain the data. Other types of memory retain and/or store the data when a power source is unavailable.

"Uncorrectable BER" refers to a measure of a rate indicating a number of bits that are that are uncorrectable and in error for a given number of bits that are processed. Bits that are uncorrectable are deemed uncorrectable after one or more error correction techniques are attempted such as use of Error Correction Codes (ECC), use of Bose, Chaudhuri, Hocquenghem (BCH) codes, use of a Low Density Parity Check (LDPC) algorithm, and the like.

"Fail bit count" refers to a measure of a number of bits that are in error for a given unit of measure. Bits that are in error are bits that were stored with one value but then when the same bits where read or sensed the bit indicated a different value. Fail bit counts may be measured for a data block (e.g., 4K), an erase block, a page, a logical erase block, a zone, a namespace, or the like. Said another way, the failed bit count may be a number of bits that differ between data written to a data block, physical erase block, or other grouping of memory cells and data subsequently read from data block, physical erase block, or other grouping of memory cells.

The storage system 100 includes at least one storage device 200, including a storage controller 104 and one or more memory die 116, connected by a bus 120. In some embodiments, the storage system 100 may include two or more memory devices. "Storage device" refers to any hardware, system, sub-system, circuit, component, module, non-volatile memory media, hard disk drive, storage array, device, or apparatus configured, programmed, designed, or engineered to store data for a period of time and retain the data in the storage device while the storage device is not using power from a power supply. Examples of storage devices include, but are not limited to, a hard disk drive, FLASH memory, MRAM memory, a Solid-State storage device, Just a Bunch Of Disks (JBOD), Just a Bunch Of Flash (JBOF), an external hard disk, an internal hard disk, and the like.

"Memory die" refers to a small piece of semiconducting material on which a given functional circuit is fabricated. Typically, integrated circuits are produced in large batches on a single wafer of electronic-grade silicon (EGS) or other semiconductor (such as GaAs) through processes such as photolithography. The wafer is cut (diced) into many pieces, each containing one copy of the circuit. Each of these pieces is called a die or memory die. (Search "die (integrated circuit)" on Wikipedia.com Oct. 9, 2019. Accessed Nov. 18, 2019.) A memory die is a die, in one embodiment, that includes one or more functional circuits for operating as a non-volatile memory media and/or a non-volatile memory array.

"Non-volatile memory media" refers to any hardware, device, component, element, or circuit configured to maintain an alterable physical characteristic used to represent a binary value of zero or one after a primary power source is removed. Examples of the alterable physical characteristic include, but are not limited to, a threshold voltage for a transistor, an electrical resistance level of a memory cell, a current level through a memory cell, a magnetic pole orientation, a spin-transfer torque, and the like. The alterable physical characteristic is such that, once set, the physical characteristic stays sufficiently fixed such that when a primary power source for the non-volatile memory media is unavailable the alterable physical characteristic can be measured, detected, or sensed, when the binary value is read, retrieved, or sensed. Said another way, non-volatile memory media is a storage media configured such that data stored on the non-volatile memory media is retrievable after a power source for the non-volatile memory media is removed and then restored. Non-volatile memory media may include one or more non-volatile memory elements, which may include, but are not limited to: chips, packages, planes, memory die, and the like. Examples of non-volatile memory media include but are not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random-access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. While the non-volatile memory media is referred to herein as "memory media," in various embodiments, the non-volatile memory media may more generally be referred to as non-volatile memory. Because non-volatile memory media is capable of storing data when a power supply is removed, the non-volatile memory media may also be referred to as a recording media, non-volatile recording media, non-volatile storage media, storage, non-volatile memory, volatile memory medium, non-volatile storage medium, non-volatile storage, or the like. In certain embodiments, data stored in non-volatile memory media is addressable at a block level which means that the data in the non-volatile memory media is organized into data blocks that each have a unique logical address (e.g., LBA). In other embodiments, data stored in non-volatile memory media is addressable at a byte level which means that the data in the non-volatile memory media is organized into bytes (8 bits) of data that each have a unique address, such as a logical address. One example of byte addressable non-volatile memory media is storage class memory (SCM).

"Non-volatile storage media" refers to any hardware, device, component, element, or circuit configured to maintain an alterable physical characteristic used to represent a binary value of zero or one after a primary power source is removed. Non-volatile storage media may be used interchangeably herein with the term non-volatile memory media.

"Non-volatile memory" refers to shorthand name for non-volatile memory media. In certain embodiments, non-volatile memory media refers to the non-volatile memory media and the logic, controllers, processor(s), state machine(s), and/or other periphery circuits that manage the non-volatile memory media and provide access to the non-volatile memory media.

"Non-volatile memory array" refers to a set of non-volatile memory storage cells (also referred to as memory cells or non-volatile memory cells) organized into an array structure having rows and columns. A memory array is addressable using a row identifier and a column identifier.

"Memory cell" refers to a type of storage media configured to represent one or more binary values by way of a determinable physical characteristic of the storage media when the storage media is sensed, read, or detected to determine what binary value(s) was last stored in the memory cell. Memory cell and storage cell are used interchangeably herein.

"Storage cell" refers to a type of storage media configured to represent one or more binary values by way of a determinable characteristic of the storage media when the storage media is sensed, read, or detected to determine a binary value(s) stored, or represented by, the determinable characteristic of the memory cell. Storage cell and memory cell are used interchangeably herein. The type of determinable characteristic used to store data in a memory cell may vary depending on the type of memory or storage technology used. For example, in flash memory cells in which each memory cell includes a transistor having a source lead, a drain lead and a gate, the determinable characteristic is a voltage level that when applied to the gate causes the memory cell to conduct a current between the drain and the source leads. The voltage level, in this example, is referred to herein as a threshold voltage. A threshold voltage may also be referred to as a control gate reference voltage (CGRV), read voltage, or reference voltage. Examples of the determinable physical characteristic include, but are not limited to, a threshold voltage for a transistor, an electrical resistance level of a memory cell, a current level through a memory cell, a magnetic pole orientation, a spin-transfer torque, and the like. Storage cell and memory cell are used interchangeably herein. "Threshold voltage" refers to a voltage level that when applied to a gate electrode of a transistor causes the transistor to conduct a current between the drain electrode and source electrode.

Each storage device 200 may include two or more memory die 116, such as flash memory, nano random-access memory ("nano RAM or NRAM"), magneto-resistive RAM ("MRAM"), dynamic RAM ("DRAM"), phase change RAM ("PRAM"), etc. In further embodiments, the data storage device 200 may include other types of non-volatile and/or volatile data storage, such as dynamic RAM ("DRAM"), static RAM ("SRAM"), magnetic data storage, optical data storage, and/or other data storage technologies. The memory die 116 may be configured into a non-volatile memory array 126. "Memory array" refers to a set of storage cells (also referred to as memory cells) organized into an array structure having rows and columns. A memory array is addressable using a row identifier and a column identifier.

Consequently, a non-volatile memory array is a memory array having memory cells configured such that a characteristic (e.g., threshold voltage level, resistance level, conductivity, etc.) of the memory cell used to represent stored data remains a property of the memory cell without a requirement for using a power source to maintain the characteristic.

A memory array is addressable using a row identifier and a column identifier. Those of skill in the art recognize that a memory array may include the set of memory cells within a plane, the set of memory cells within a memory die, the set of memory cells within a set of planes, the set of memory cells within a set of memory die, the set of memory cells within a memory package, the set of memory cells within a set of memory packages, or with other known memory cell set architectures and configurations. "Plane" refers to a division of a die that permits certain storage operations to be performed on both planes using certain physical row addresses and certain physical column addresses.

A memory array may include a set of memory cells at a number of levels of organization within a storage or memory system. In one embodiment, memory cells within a plane may be organized into a memory array. In one embodiment, memory cells within a plurality of planes of a memory die may be organized into a memory array. In one embodiment, memory cells within a plurality of memory dies of a memory device may be organized into a memory array. In one embodiment, memory cells within a plurality of memory devices of a storage system may be organized into a memory array.

The storage device 200, also referred to herein as a storage device, may be a component within a host 102 as depicted in here, and may be connected using a data bus 122, such as a peripheral component interconnect express ("PCIe") bus, a Serial Advanced Technology Attachment ("serial ATA") bus, or the like. In another embodiment, the storage device 200 is external to the host 102 and is connected, a universal serial bus ("USB") connection, an Institute of Electrical and Electronics Engineers ("IEEE") 1394 bus ("FireWire"), or the like. In other embodiments, the storage device 200 is connected to the host 102 using a peripheral component interconnect ("PCI") express bus using external electrical or optical bus extension or bus networking solution such as InfiniBand or PCI Express Advanced Switching ("PCIe-AS"), or the like.

In various embodiments, the storage device 200 may be in the form of a dual-inline memory module ("DIMM"), a daughter card, or a micro-module. In another embodiment, the storage device 200 is a component within a rack-mounted blade. In another embodiment, the storage device 200 is contained within a package that is integrated directly onto a higher-level assembly (e.g., mother board, laptop, graphics processor). "Processor" refers to any circuitry, component, chip, die, package, or module configured to receive, interpret, decode, and execute machine instructions. Examples of a processor may include, but are not limited to, a central processing unit, a general-purpose processor, an application-specific processor, a graphics processing unit (GPU), a field programmable gate array (FPGA), Application Specific Integrated Circuit (ASIC), System on a Chip (SoC), virtual processor, processor core, and the like. In another embodiment, individual components including the storage device 200 are integrated directly onto a higher-level assembly without intermediate packaging.

In a further embodiment, instead of being connected directly to the host 102 as DAS, the data storage device 200 may be connected to the host 102 over a data network. For example, the data storage device 200 may include a storage area network ("SAN") storage device, a network attached storage ("NAS") device, a network share, or the like. In one embodiment, the storage system 100 may include a data network, such as the Internet, a wide area network ("WAN"), a metropolitan area network ("MAN"), a local area network ("LAN"), a token ring, a wireless network, a fiber channel network, a SAN, a NAS, ESCON, or the like, or any combination of networks. A data network may also include a network from the IEEE 802 family of network technologies, such Ethernet, token ring, Wi-Fi, Wi-Max, and the like. A data network may include servers, switches, routers, cabling, radios, and other equipment used to facilitate networking between the host 102 and the data storage device 200.

The storage system 100 includes at least one host 102 connected to the storage device 200. "Host" refers to any computing device or computer device or computer system configured to send and receive storage commands. Examples of a host include, but are not limited to, a computer, a laptop, a mobile device, an appliance, a virtual machine, an enterprise server, a desktop, a tablet, a main frame, and the like.

Multiple hosts 102 may be used and may include a server, a storage controller of a storage area network ("SAN"), a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. In another embodiment, a host 102 may be a client and the storage device 200 operates autonomously to service data requests sent from the host 102. In this embodiment, the host 102 and storage device 200 may be connected using a computer network, system bus, Direct Attached Storage (DAS) or other communication means suitable for connection between a computer and an autonomous storage device 200.

The depicted embodiment shows a user application 106 in communication with a storage client 108 as part of the host 102. In one embodiment, the user application 106 is a software application operating on or in conjunction with the storage client 108.

The storage client 108 manages files and data and utilizes the functions and features of the storage controller 104 and associated memory die 116. Representative examples of storage clients include, but are not limited to, a server, a file system, an operating system, a database management system ("DBMS"), a volume manager, and the like. The storage client 108 is in communication with the storage controller 104 within the storage device 200. In some embodiments, the storage client 108 may include remote storage clients operating on hosts 110 or otherwise accessible via the network 112. Storage clients may include, but are not limited to operating systems, file systems, database applications, server applications, kernel-level processes, user-level processes, applications, and the like.

The storage client 108 may present a logical address space 114 to the host 102 and/or user application 106. The logical address space 114 may include a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

"Logical address space" refers to a logical representation of memory resources. The logical address space may include a plurality (e.g., range) of logical addresses. "Logical address" refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like. A logical address does not indicate the physical location of data on the storage media but is an abstract reference to the data. "Logical block address" refers to a value used in a block storage device to associate each of n logical blocks available for user data storage across the storage media with an address. In certain block storage devices, the logical block addresses (LBAs) may range from 0 to n per volume or partition. In block storage devices, each LBA maps directly to a particular data block, and each data block maps to a particular set of physical sectors on the physical storage media.

In one embodiment, a device driver for the host 102 (and/or the storage client 108) may maintain metadata 118 within the storage client 108, such as a logical to physical address mapping structure, to map logical addresses of the logical address space 114 to storage locations on the memory die 116. In another embodiment, such metadata 118 may be stored and maintained by a storage controller 104. A device driver may be configured to provide storage services to one or more storage clients.

The storage client 108 may include the flash translation layer 124. "Flash translation layer" refers to logic in a FLASH memory device that includes logical-to-physical address translation providing abstraction of the logical block addresses used by the storage client and the physical block addresses at which the storage controller stores data. The logical-to-physical translation layer maps logical block addresses (LBAs) to physical addresses of data stored on solid-state storage media. This mapping allows data to be referenced in a logical block address space using logical identifiers, such as a block address. A logical identifier does not indicate the physical location of data on the solid-state storage media but is an abstract reference to the data.

The flash translation layer 124 receives the processed data as well as one or more control signals to determine the flash translation layer queue depth. The flash translation layer 124 may determine an appropriate physical address to send data and commands to the memory die 116 and the volatile memory. In certain embodiments, a storage client 108 may include the flash translation layer 124 and may manage metadata 118 associated with the flash translation layer 124. In one embodiment, the flash translation layer 124 also receives the data outputs from the memory die 116.

In one embodiment, the storage system 100 includes one or more clients connected to one or more hosts 110 through one or more computer networks 112. A host 110 may be a server, a storage controller of a SAN, a workstation, a personal computer, a laptop computer, a handheld computer, a supercomputer, a computer cluster, a network switch, router, or appliance, a database or storage appliance, a data acquisition or data capture system, a diagnostic system, a test system, a robot, a portable electronic device, a wireless device, or the like. The network 112 may include the Internet, a wide area network ("WAN"), a metropolitan area network ("MAN"), a local area network ("LAN"), a token ring, a wireless network, a fiber channel network, a SAN, network attached storage ("NAS"), ESCON, or the like, or any combination of networks. The network 112 may also include a network from the IEEE 802 family of network technologies, such Ethernet, token ring, WiFi, WiMax, and the like.

The network 112 may include servers, switches, routers, cabling, radios, and other equipment used to facilitate networking the host 102 or hosts and host 110 or clients. In one embodiment, the storage system 100 includes multiple hosts that communicate as peers over a network 112. In another embodiment, the storage system 100 includes multiple memory devices that communicate as peers over a network 112. One of skill in the art will recognize other computer networks including one or more computer networks and related equipment with single or redundant connection between one or more clients or other computer with one or more memory devices or one or more memory devices connected to one or more hosts. In one embodiment, the storage system 100 includes two or more memory devices connected through the network 112 to a host 110 without a host 102.

In one embodiment, the storage client 108 communicates with the storage controller 104 through a host interface including an Input/Output (I/O) interface. For example, the storage device 200 may support the ATA interface standard, the ATA Packet Interface ("ATAPI") standard, the small computer system interface ("SCSI") standard, and/or the Fibre Channel standard which are maintained by the Inter-National Committee for Information Technology Standards ("INCITS").

In certain embodiments, the storage media of a memory device is divided into volumes or partitions. Each volume or partition may include a plurality of sectors. Traditionally, a sector is 512 bytes of data. One or more sectors are organized into a block (referred to herein as both block and data block, interchangeably).

In one example embodiment, a data block includes eight sectors which is 4 KB. In certain storage systems, such as those interfacing with the Windows® operating systems, the data blocks are referred to as clusters. In other storage systems, such as those interfacing with UNIX, Linux, or similar operating systems, the data blocks are referred to simply as blocks. A block or data block or cluster represents a smallest physical amount of storage space on the storage media that is managed by a storage manager, such as a storage controller, storage system, storage unit, storage device, or the like.

In some embodiments, the storage controller 104 may be configured to store data on one or more asymmetric, write once storage media, such as solid-state storage memory cells within the memory die 116.

"Write once storage media" refers to a storage media such as a storage cell that must be reinitialized (e.g., erased) before new data or a change to the data is written or programmed thereon. In other words, data of a write once storage media cannot be overwritten, the write once storage media must be erased before subsequently writing data to the write once storage media.

"Read scan operation" refers to a maintenance operation performed to identify and mitigate or avoid or counter errors in the data or storage cells and/or other components of a non-volatile storage device. A read scan operation may be referred to, interchangeably, as a "read scan" or "read scan operation." In one embodiment, a read scan operation involves reading data from, or sensing a determinable physical characteristic, or a memory state of storage cells in a storage block. Next, the read scan operation checks the memory states of the storage cells for any errors, corrects as many errors as possible, and determines a BER. Then, the read scan operation determines if the BER satisfies a threshold such as a read BER threshold. In one embodiment, the read scan operation reads data from each logical page, or word line, of the storage block. In another embodiment, the read scan operation selects less than all of the logical pages of the storage block. In other words, the read scan operation may sample the logical pages of the storage block from which to read data for the read scan operation. If a read BER threshold is satisfied, the read scan operation then may perform a data scrub operation or a data refresh operation. In certain embodiments, a read scan operation may always include a data scrub operation or a data refresh operation. In other embodiments, performing a data scrub operation or data refresh operation may be conditioned on the BER satisfying a read BER threshold. In such embodiments, a read scan operation may be referred to as a "read scrub" or "read scrub operation." In these embodiments, a read scan operation may conditionally include a data scrub operation. In certain embodiments, a read scan operation may operate as a foreground process meaning that the read scan operation interrupts, or delays, a non-volatile storage device from servicing read commands or write commands for a host. In addition, the read scan operation may need to complete working on a particular storage block and thereby delay a host read command for data on that particular storage block. Thus, a read scan operation may impact quality of service levels between a host and the non-volatile storage device.

As used herein, an "asymmetric" storage media refers to a storage media having different latencies for different storage operations. Many types of solid-state storage media (e.g., memory die) are asymmetric; for example, a read operation may be much faster than a write/program operation, and a write/program operation may be much faster than an erase operation (e.g., reading the storage media may be hundreds of times faster than erasing, and tens of times faster than programming the storage media). The memory die 116 may be partitioned into memory divisions that can be erased as a group (e.g., erase blocks) in order to, inter alia, account for the asymmetric properties of the memory die 116 or the like.

As such, modifying a single data segment in-place may include erasing the entire erase block including the data, and rewriting the modified data to the erase block, along with the original, unchanged data. This may result in inefficient write amplification, which may excessively wear the memory die 116. "Write amplification" refers to a measure of write programming operations performed on a non-volatile storage device which result in writing any data, and user data in particular, more times than initially writing the data in a first instance. In certain embodiments, write amplification may count the number of write operations performed by a non-volatile storage device in order to manage and maintain the data stored on the non-volatile storage device. In other embodiments, write amplification measures the amount of data, the number of bits, written that are written beyond an initial storing of data on the non-volatile storage device.

Therefore, in some embodiments, the storage controller 104 may be configured to write data out-of-place. As used herein, writing data "out-of-place" refers to writing data to different media storage location(s) rather than overwriting the data "in-place" (e.g., overwriting the original physical location of the data). Modifying data out-of-place may avoid write amplification, since existing, valid data on the erase block with the data to be modified need not be erased and recopied. "Valid data" refers to data of a storage block that was stored by a host and should be preserved and maintained until the host indicates that the data is no longer needed, and either can, or should be, deleted. Moreover, writing data out-of-place may remove erasure from the latency path of many storage operations (e.g., the erasure latency is no longer part of the main path of a write operation).

Management of a data block by a storage manager includes specifically addressing a particular data block for a read operation, write operation, or maintenance operation. A block storage device may associate n blocks available for user data storage across the storage media with a logical address, numbered from 0 to n. In certain block storage devices, the logical addresses may range from 0 to n per volume or partition.

In conventional block storage devices, a logical address maps directly to a particular data block on physical storage media. In conventional block storage devices, each data block maps to a particular set of physical sectors on the physical storage media. However, certain storage devices do not directly or necessarily associate logical addresses with particular physical data blocks. These storage devices may emulate a conventional block storage interface to maintain compatibility with a block storage client 108.

In one embodiment, the storage controller 104 provides a block I/O emulation layer, which serves as a block device interface, or API. In this embodiment, the storage client 108 communicates with the storage device through this block device interface. In one embodiment, the block I/O emulation layer receives commands and logical addresses from the storage client 108 in accordance with this block device interface. As a result, the block I/O emulation layer provides the storage device compatibility with a block storage client 108.

In one embodiment, a storage client 108 communicates with the storage controller 104 through a host interface including a direct interface. In this embodiment, the storage device directly exchanges information specific to non-volatile storage devices. "Non-volatile storage device" refers to any hardware, device, component, element, or circuit configured to maintain an alterable physical characteristic used to represent a binary value of zero or one after a primary power source is removed. Examples of a non-volatile storage device include, but are not limited to, a hard disk drive (HDD), Solid-State Drive (SSD), non-volatile memory media, and the like.

A storage device using direct interface may store data in the memory die 116 using a variety of organizational constructs including, but not limited to, blocks, sectors, pages, logical blocks, logical pages, erase blocks, logical erase blocks, ECC codewords, logical ECC codewords, or in any other format or structure advantageous to the technical characteristics of the memory die 116.

The storage controller 104 receives a logical address and a command from the storage client 108 and performs the corresponding operation in relation to the memory die 116. The storage controller 104 may support block I/O emulation, a direct interface, or both. "Storage controller" refers to any hardware, device, component, element, or circuit configured to manage data operations on non-volatile memory media, and may include one or more processors, programmable processors (e.g., FPGAs), ASICs, micro-controllers, or the like. In some embodiments, the storage controller is configured to store data on and/or read data from non-volatile memory media, to transfer data to/from the non-volatile memory device(s), and so on.

Figure 2:
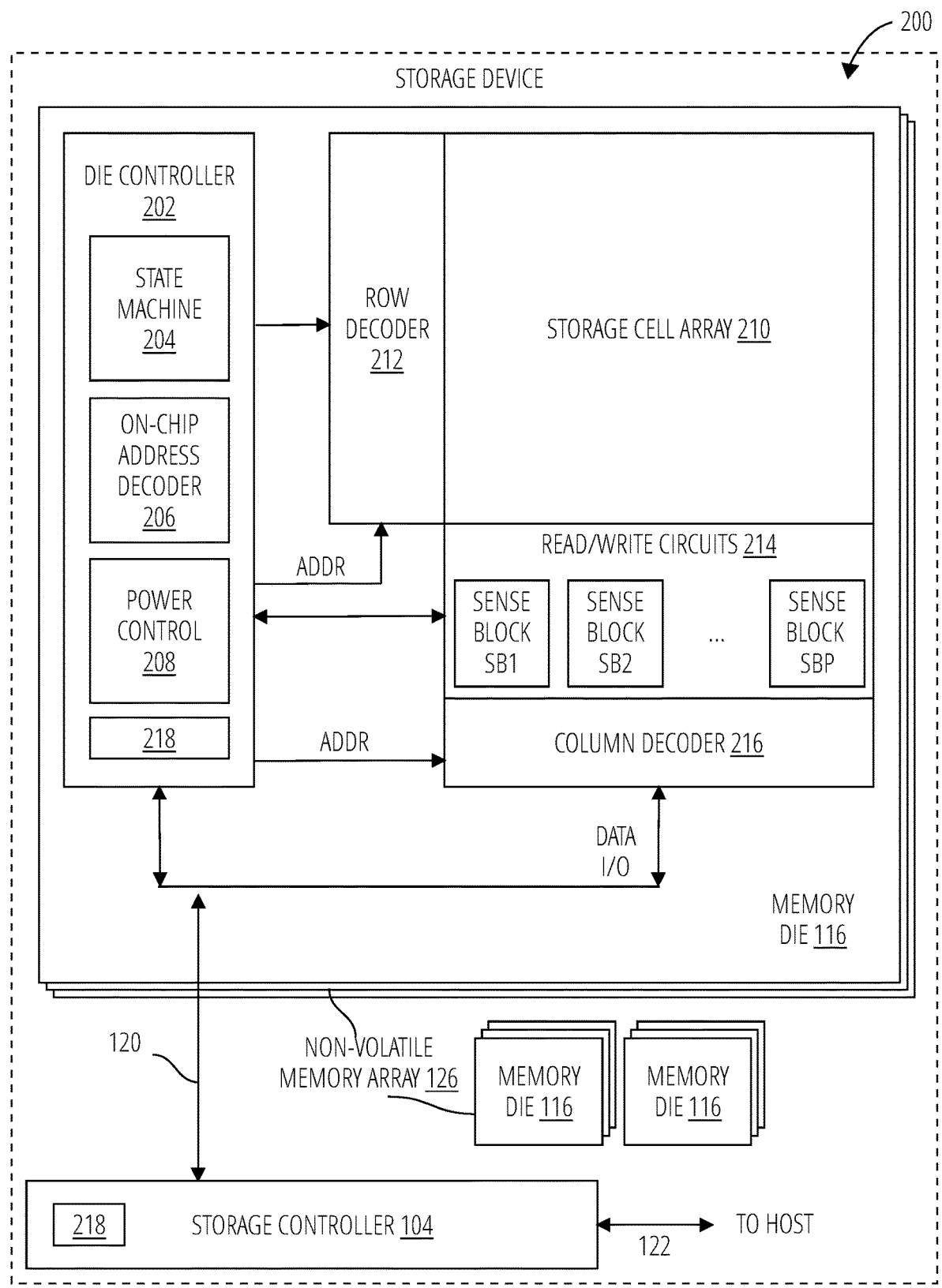
FIG. 2 is a block diagram depiction of a storage device 200 in one embodiment.

FIG. 2 is a block diagram of a storage device 200. The storage device 200 may include a storage controller 104 and a non-volatile memory array 126. Each memory die 116 in the non-volatile memory array 126 may include a die controller 202 and at least one storage cell array 210 in the form of a three-dimensional array and read/write circuits 214.

The storage controller 104 and/or the die controller 202 may incorporate logic 218 implementing the disclosed solution. "Die controller" refers to control logic dedicated to a particular memory die. A die controller may be discrete logic (e.g., a different circuit or circuit package) or may be a logic subset in a more general storage controller.

The storage cell array 210 is addressable by word line, which corresponds to a row, via a row decoder 212 and by bit line via a column decoder 216. "Word line" refers to a structure within a memory array including a set of memory cells. The memory array is configured such that the operational memory cells of the word line are read or sensed during a read operation. Similarly, the memory array is configured such that the operational memory cells of the word line are read, or sensed, during a read operation.

The read/write circuits 214 include multiple sense blocks SB1, SB2, . . . , SBp (sensing circuitry) and enable a page of memory cells to be read or programmed in parallel. "Parallel" refers to two or more operations that overlap in time. Parallel operation includes but is not limited to operations that are co-extensive in time, and also refers to operations that overlap by any time interval. In certain embodiments, each memory cell across a row of the memory array together form a physical page.

"Bit line" refers to a circuit structure configured to deliver a voltage and/or conduct current to a column of a memory array. In one embodiment, the column includes a NAND string or memory string and may also be referred to as channel. In one embodiment, the column is referred to as a NAND string and the NAND string includes a channel. In one embodiment, a bit line connects to a NAND string at a drain end or drain side of the NAND string. A memory array may have one bit line for each memory cell along the word lines of the memory array.

A physical page may include memory cells along a row of the memory array for a single plane or for a single memory die. In one embodiment, the memory die includes a memory array made up of two equal sized planes. In one embodiment, a physical page of one plane of a memory die includes four data blocks (e.g., 16 KB). In one embodiment, a physical page (also called a "die page") of a memory die includes two planes each having four data blocks (e.g., 32 KB).

Commands and data, such as those to enact storage operation 128, are transferred between the host 102 and storage controller 104 via a data bus 122, and between the storage controller 104 and the one or more memory die 116 via bus 120.

The storage cell array 210 can be two-dimensional (2D—laid out in a single fabrication plane) or three-dimensional (3D—laid out in multiple fabrication planes). The storage cell array 210 may include one or more arrays of memory cells including a 3D array. In one embodiment, the storage cell array 210 may include a monolithic three-dimensional memory structure (3D array) in which multiple memory levels are formed above (and not in) a single substrate, such as a wafer, with no intervening substrates. The storage cell array 210 may include any type of non-volatile memory that is monolithically formed in one or more physical levels of arrays of memory cells having an active area disposed above a silicon substrate. The storage cell array 210 may be in a non-volatile solid-state drive having circuitry associated with the operation of the memory cells, whether the associated circuitry is above or within the substrate.

"Circuitry" refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random-access memory), or circuitry forming a communications device (e.g., a modem, communications switch, or optical-electrical equipment).

Word lines may include sections of the layers containing memory cells, disposed in layers above the substrate. Multiple word lines may be formed on single layer by means of trenches or other non-conductive isolating features.

The die controller 202 cooperates with the read/write circuits 214 to perform memory operations on memory cells of the storage cell array 210, and includes a state machine 204, an address decoder 206, and a power control 208. The state machine 204 provides chip-level control of memory operations.

The address decoder 206 provides an address interface between that used by the host or a storage controller 104 to the hardware address used by the row decoder 212 and column decoder 216. The power control 208 controls the power and voltages supplied to the various control lines during memory operations. The power control 208 and/or read/write circuits 214 can include drivers for word lines, source gate select (SGS) transistors, drain gate select (DGS) transistors, bit lines, substrates (in 2D memory structures), charge pumps, and source lines. In certain embodiments, the power control 208 may detect a sudden loss of power and take precautionary actions. The power control 208 may include various first voltage generators (e.g., the drivers) to generate the voltages described herein. The sense blocks can include bit line drivers and sense amplifiers in one approach.

In some implementations, some of the components can be combined. In various designs, one or more of the components (alone or in combination), other than storage cell array 210, can be thought of as at least one control circuit or storage controller which is configured to perform the techniques described herein. For example, a control circuit may include any one of, or a combination of, die controller 202, state machine 204, address decoder 206, column decoder 216, power control 208, sense blocks SB1, SB2, . . . , SBp, read/write circuits 214, storage controller 104, and so forth.

In one embodiment, the host 102 is a computing device (e.g., laptop, desktop, smartphone, tablet, digital camera) that includes one or more processors, one or more processor readable storage devices (RAM, ROM, flash memory, hard disk drive, solid-state memory) that store processor readable code (e.g., software) for programming the storage controller 104 to perform the methods described herein. The host may also include additional system memory, one or more input/output interfaces and/or one or more input/output devices in communication with the one or more processors, as well as other components well known in the art.

Associated circuitry is typically used for operation of the memory cells and for communication with the memory cells. As non-limiting examples, memory devices may have circuitry used for controlling and driving memory cells to accomplish functions such as programming and reading. This associated circuitry may be on the same substrate as the memory cells and/or on a separate substrate. For example, a storage controller for memory read-write operations may be located on a separate storage controller chip and/or on the same substrate as the memory cells.

One of skill in the art will recognize that the disclosed techniques and devices are not limited to the two-dimensional and three-dimensional exemplary structures described but covers all relevant memory structures within the spirit and scope of the technology as described herein and as understood by one of skill in the art.

Figure 3A:
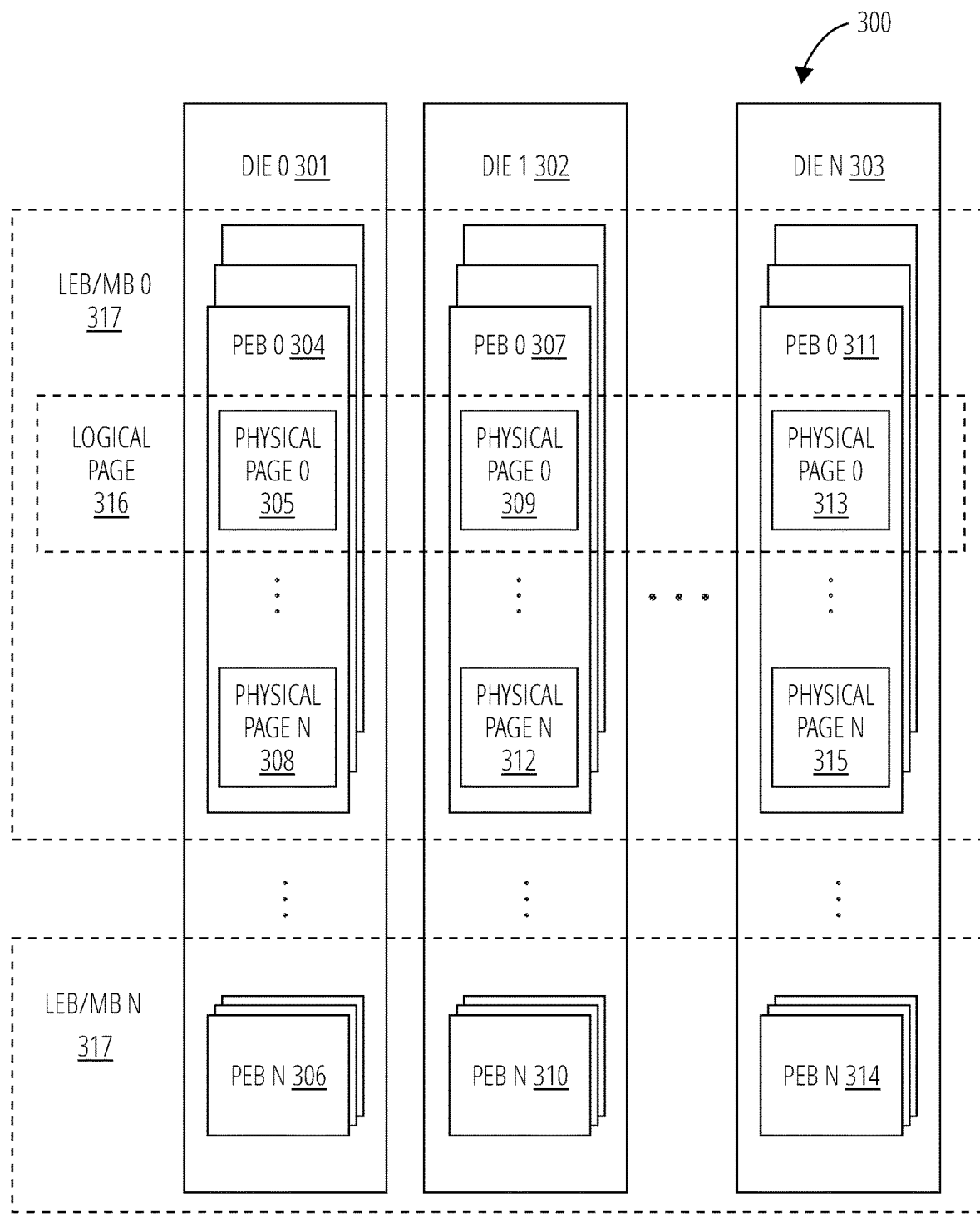
FIG. 3A depicts a memory array 300 in accordance with one embodiment.

FIG. 3A depicts a memory array 300 in accordance with one embodiment. In the illustrated embodiment, memory array 300 is organized into logical erase blocks (LEBs), as shown by logical erase block 317 (also referred to herein as a "metablock" or "superblock" or "memory meta-block"). "Memory meta-block" refers to a block spanning multiple memory die and/or memory planes. These LEBs include multiple physical erase blocks (PEBs) illustrated by physical erase block 0 304, physical erase block n 306, physical erase block 0 307, physical erase block n 310, physical erase block 0 311, and physical erase block n 314. "Physical erase block" refers to smallest storage unit within a given memory die that can be erased at a given time (e.g., due to the wiring of storage cells on the memory die).

The physical erase blocks may be located in separate storage dies, shown as die 0 301, die 1 302, and die n 303. In certain embodiments, a die is divided into planes. A plane may be understood as a division of a die that permits certain storage operations to be performed in parallel using certain physical row addresses and certain physical column addresses.

Those of skill in the art appreciate the relationship and differences between physical erase blocks and a logical erase blocks and may refer to one, or the other, or both by using the shorthand version erase block, block, or storage block. Those of skill in the art understand from the context of the reference to an erase block whether a physical erase block or a logical erase block (or metablock or superblock) is being referred to. The concepts and techniques used in the art and those recited in the claims can be equally applied to either physical erase blocks or logical erase blocks.

"Erase block" refers to a logical erase block or a physical erase block. In one embodiment, a physical erase block represents the smallest storage unit within a given memory die that can be erased at a given time (e.g., due to the wiring of storage cells on the memory die). In one embodiment, logical erase blocks represent the smallest storage unit, or storage block, erasable by a storage controller in response to receiving an erase command. In such an embodiment, when the storage controller receives an erase command specifying a particular logical erase block, the storage controller may erase each physical erase block within the logical erase block simultaneously. It is noted that physical erase blocks within a given logical erase block may be considered as contiguous within a physical address space even though they reside in separate dies. Thus, the term "contiguous" may be applicable not only to data stored within the same physical medium, but also to data stored within separate media. "Simultaneously" refers to any parallel or partially parallel operation in time.

"Storage block" refers to a set of storage cells organized such that storage operations can be performed on groups of storage cells in parallel. The organization of the set of storage cells may be implemented at a physical level or a logical level. Thus, a storage block, in one embodiment, may include a physical page, such as a word line, a logical page including physical pages that span planes and/or memory die, a physical erase block including a set of physical pages, a logical erase block (LEB) including a set of logical pages, or the like. A storage block may be referred to herein as a "block", a "memory block" or a LEB.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

"Logical erase block" refers to another term for a storage block. In certain embodiments, a logical erase block refers to a set of logical pages that span planes, memory die, and/or chips. This organization of storage cells is deemed 'logical' because the physical pages may not be directly coupled to each other. However, the physical pages are operated in parallel as though they are a single page. In like manner, multiple physical erase blocks may be operated in parallel as though they are a single erase block and are thus referred to as logical erase blocks. The terms logical erase block, metablock, and super block are used interchangeably herein. "Logical page" refers to a collection of physical page that are treated as a single page for storage operations. "Physical page" refers to physical page represents the smallest storage block within a given memory die that can be written to in a single operation.

A logical erase block such as logical erase block 317 is further divided into multiple logical pages (logical page 316) that, in turn, includes multiple physical pages, such as physical page 0 305, physical page n 308, physical page 0 309, physical page n 312, physical page 0 313, and physical page n 315. Physical pages may include multiple packets, which may be grouped into error correction code (ECC) chunks.

In one embodiment, a physical page represents the smallest storage block within a given die that can be written to at a given time. In one embodiment, a logical page is the smallest writable storage block supported by the storage controller. (in one embodiment, the storage controller may include a buffer configured to store up to a logical page worth of data; upon filling the buffer, the storage controller may write the contents of the buffer to a single logical page in parallel.) In some instances, dividing a logical page across multiple dies may result in faster access times for a set of data when multiple dies are accessed in parallel. The logical page configurations may be mapped to any physical page on a die, or across a plurality of memory die, just as with logical erase blocks.

In some embodiments, a storage controller 104 may associate metadata, also referred to as media characteristics, with one or more of the storage blocks (logical erase blocks, physical erase blocks, logical pages, and/or physical pages). "Media characteristic (deleted)" refers to an attribute or statistic for a set of particular storage cells, such as a program/erase cycle count for the set of storage cells, a read count for the set of storage cells, a retention time since a previous write for the set of storage cells (aka a data retention time), a dwell time for the set of storage cells such as a logical or physical erase block (e.g., a time between a program of an erase block and an erase of the erase block), an average of multiple previous dwell times for the set of storage cells, an error statistic for the set of storage cells, or the like. A media characteristic for a set of storage cells may be substantially static or may be dynamic and change over time. A media characteristic, in one embodiment, is a statistic, heuristic, mathematical model, transform, or other descriptor associated with an attribute of the non-volatile memory media. A media characteristic, in one embodiment, includes or relates to a make, a model, a manufacturer, a product version, or the like for the storage device and/or for the non-volatile memory media. A media characteristic, in a further embodiment, may include or relate to an environmental condition or a use of the storage device and/or of the non-volatile memory media, such as a temperature, a use case (e.g., a cache use case, an archival use case, a server use case, an enterprise use case, a consumer use case, etc.), or the like. The storage controller 104 may manage metadata that identifies logical addresses for which a logical erase block stores data, as well as the respective numbers of stored data packets for each logical erase block, data block, or sector within a logical address space 114 (FIG. 1). A storage controller 104 may store metadata or media characteristic data in a variety of locations, including on non-volatile storage media, in volatile memory, in a structure stored with each logical erase block, or the like.

"Metadata" refers to system data usable to facilitate operation of non-volatile storage device. Metadata stands in contrast to, for example, data produced by an application (i.e., "application data"), a user, a host, or forms of data that would be considered by an operating system as "user data." For example, a logical erase block may include metadata specifying, without limitation, usage statistics (e.g., the number of program erase cycles performed on that logical erase block, health statistics (e.g., a value indicative of how often corrupted data has been read from that logical erase block), security or access control parameters, sequence information (e.g., a sequence indicator), a persistent metadata flag (e.g., indicating inclusion in an atomic storage operation), a transaction identifier, or the like. In some embodiments, a logical erase block includes metadata identifying the logical addresses for which the logical erase block stores data, as well as the respective numbers of stored data blocks/packets for each logical block or sector. In certain embodiments, the metadata includes a cross temperature for logical erase block, an average cross temperature for open logical erase blocks of the non-volatile storage device, a temperature change rate, an average program erase count for a logical erase block, an uncorrectable BER (UBER) for a logical erase block, a BER, a fail bit count for a logical erase block, and a charge leak rate. In one embodiment, metadata may include a media characteristic.

"Cross temperature" refers to a condition in which a die temperature of a memory cell at a time when the memory cell is read/sensed is different from a die temperature of the same memory cell when the memory cell was written to (programmed). More generally, as noted previously, the term can also refer to differences between the temperature when a block is opened vs closed for programming, or the temperature difference between closing two different blocks. The meaning of the term will be readily understood in context. In certain embodiments, a cross temperature may be represented by a value referred to as a cross temperature metric. In certain types of non-volatile memory media, such as NAND memory cells when the difference between die temperature when the memory cell is written and when the memory cell is read is sufficiently high, the data of the memory cell may become unreadable (a read command results in an error). Currently, non-volatile storage devices have countermeasures such that data stored in a non-volatile memory subject to a cross temperature condition can be read, however the non-volatile storage device should detect a cross temperature condition such that these countermeasures may be employed.

"Charge leak rate" refers to a rate at which charge leaks from a memory cell when the memory cell is in a passive state, not being read or written to. In one embodiment, metadata may include a media characteristic.

Figure 3B:
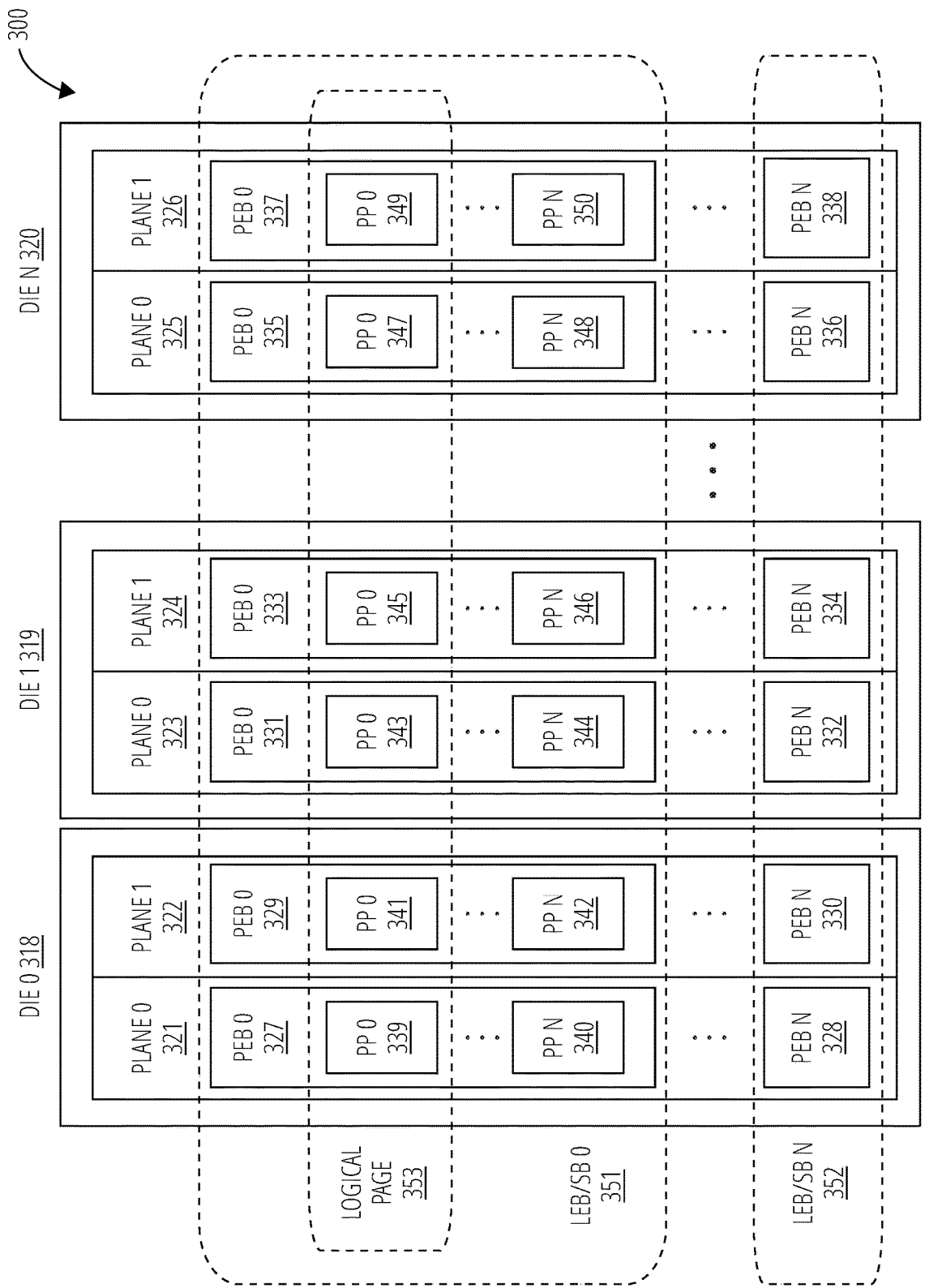
FIG. 3B depicts additional aspects of the memory array 300 in accordance with one embodiment.

FIG. 3B depicts more details of a memory array 300 organization in accordance with one embodiment. The memory array 300 includes a plurality of memory die, such as die 0 318, die 1 319, etc., through die n 320. The example depicts a die that is divided into physical planes, such as plane 0 321 and plane 1 322 of die 0 318, plane 0 323 and plane 1 324 of die 1 319, etc., through plane 0 325 and plane 1 326 of die n 320.

Each plane may be divided into physical erase blocks, as illustrated by physical erase block 0 327 through to physical erase block n 328 of plane 0 321, physical erase block 0 329 through to physical erase block n 330 of plane 0 plane 1 322, physical erase block 0 331 through to physical erase block n 332 of plane 0 323, physical erase block 0 333 through to physical erase block n 334 of plane 0 plane 1 324, physical erase block 0 335 through to physical erase block n 336 of plane 0 325, and physical erase block 0 337 through to physical erase block n 338 of plane 0 plane 1 326.

Each physical erase block can be divided into physical pages. For example, physical erase block 0 327 may include physical page 0 339 through physical page n 340, physical erase block 0 329 may include physical page 0 341 through physical page n 342, physical erase block 0 331 may include physical page 0 343 through physical page n 344, physical erase block 0 333 may include physical page 0 345 through physical page n 346, physical erase block 0 335 may include physical page 0 347 through physical page n 348, physical erase block 0 337 may include physical page 0 349 through physical page n 350.

The memory array 300 is further organized into logical erase blocks (LEBs), as shown by logical erase block/storage block 0 351 and logical erase block/storage block N 352 (also referred to herein as a "metablock" or "storage block"). These LEBs include multiple physical erase blocks (PEBs) illustrated by physical erase block 0 327, physical erase block n 328, etc. The physical erase blocks may be located in separate storage dies, shown as die 0 318, die 1 319, and die n 320.

Those of skill in the art appreciate the relationship and differences between physical erase blocks and a logical erase blocks and may refer to one, or the other, or both by using the shorthand names such as erase block, block, or storage block. Those of skill in the art understand from the context of the reference to an erase block whether a physical erase block or a logical erase block (or metablock or superblock) is being referred to. The concepts and techniques used in the art and those recited in the claims can be equally applied to either physical erase blocks or logical erase blocks.

As used herein, a "physical" structure such as a physical page, physical word line, physical erase block, physical plane, physical memory die, or the like, refers to a single physical structure that a controller, manager, module, or other logic component of a system can control and/or communicate with at some level within one or more levels of physical abstraction in the organization of the device, system, or apparatus. Similarly, a "logical" structure such as a logical page, logical word line, logical erase block, logical plane, logical memory die, or the like, refers to a collection of two or more single physical structures of that same type that a controller, manager, module, or other logic component of the system can control and/or communicate with at some level within one or more levels of physical abstraction in the organization of the device, system, or apparatus. It should be noted that one or the other or both a "physical" structure and a "logical" structure may have distinct addresses that can be used to identify one "physical" structure or "logical" structure relative to other structures of a similar nature and type.

A logical erase block such as logical erase block/storage block 0 351 or logical erase block/storage block N 352 is further divided into multiple logical pages (logical page 353) that, in turn, includes multiple physical pages, such as physical page 0 339, physical page 0 341, physical page 0 343, physical page 0 345, physical page 0 347, and physical page 0 349, as illustrated. Physical pages may include multiple packets, which may be grouped into error correction code (ECC) chunks.

In one embodiment, a physical page represents the smallest storage block within a given die that can be written to at a given time. In one embodiment, a physical page may include a single word line.

In another embodiment, a logical page is the smallest writable storage block supported by the storage controller. (in one embodiment, the storage controller may include a buffer configured to store up to a logical page worth of data; upon filling the buffer, the storage controller may write the contents of the buffer to a single logical page simultaneously.) In certain embodiments, a logical page may be referred to simply as a word line, with the understanding that the logical page includes one word line on each plane and/or memory die of the memory array 300.

In certain embodiments, the logical page spans planes within a memory die or spans planes within multiple memory die. In some instances, dividing a logical page across multiple dies may result in faster access times for a set of data when multiple dies are accessed in parallel. The logical page configurations may be mapped to any physical page on a die, or across a plurality of memory die, just as with logical erase blocks.

For example, a logical erase block may include metadata specifying, without limitation, usage statistics (e.g., the number of program erase cycles performed on that logical erase block, health statistics (e.g., a value indicative of how often corrupted data has been read from that logical erase block), security or access control parameters, sequence information (e.g., a sequence indicator), a persistent metadata flag (e.g., indicating inclusion in an atomic storage operation), a transaction identifier, or the like. In some embodiments, a logical erase block includes metadata identifying the logical addresses for which the logical erase block stores data, as well as the respective numbers of stored data blocks/packets for each logical block or sector.

In certain embodiments, the metadata includes one or more of a cross temperature for logical erase block, an average cross temperature for open logical erase blocks of the non-volatile storage device, a temperature change rate, an average program erase count for a logical erase block, an uncorrectable BER (UBER) for a logical erase block, a BER, a fail bit count for a logical erase block, and a charge leak rate. In one embodiment, metadata may include a media characteristic.

Figure 4:
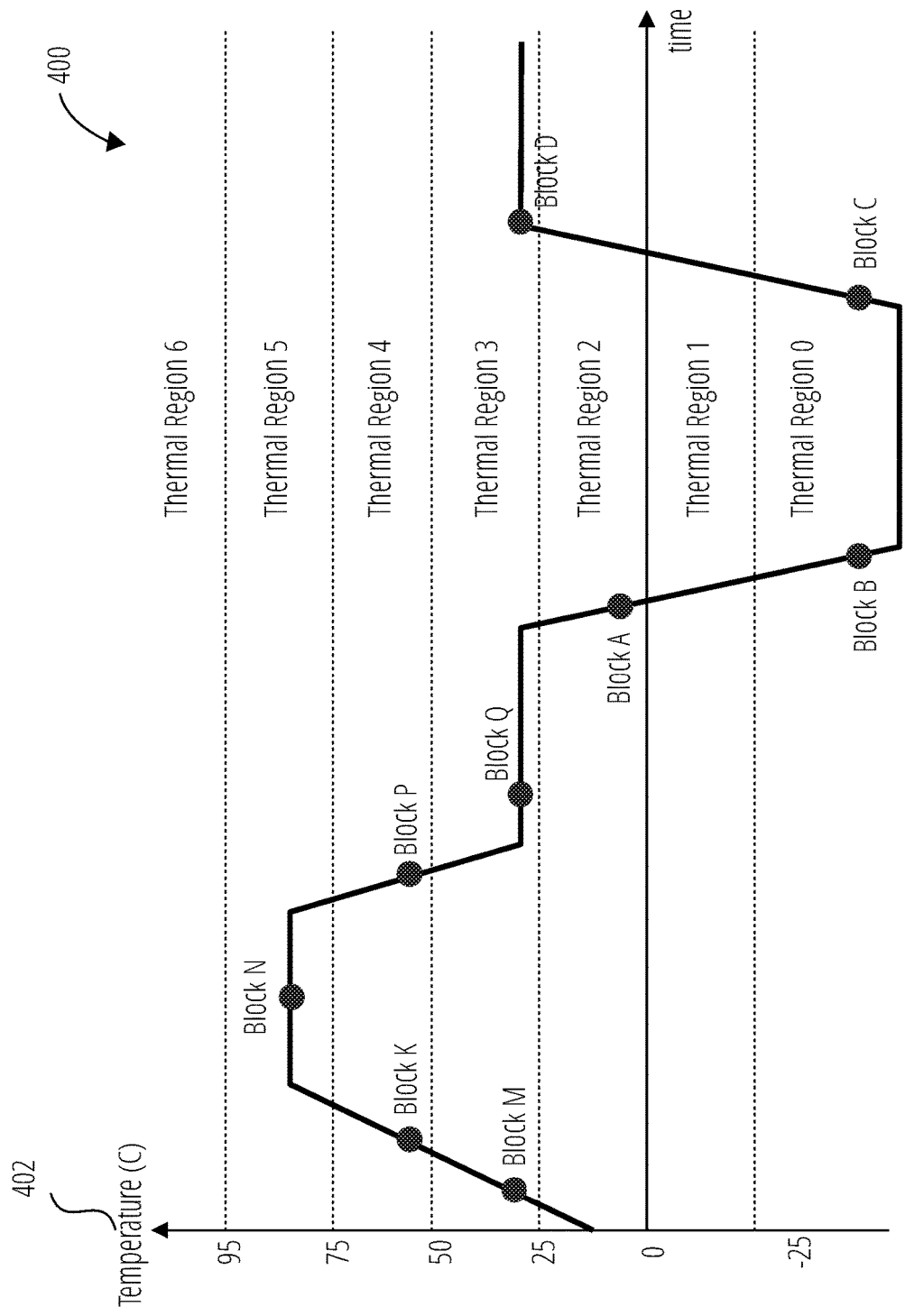
FIG. 4 depicts an example of programming temperature variation 400 in a storage devices.

FIG. 4 depicts a graph of programming temperature variation 400 in one embodiment. The graph depicts the variation of block closure temperature 402 in degrees Celsius from block to block as execution time elapses. Block M and Block Q are closed in thermal region 3, but there's an intervening cross-temperature event to thermal region 5; likewise for Block K and Block P, both closed in thermal region 4. The intervening cross-temperature event to thermal region 5 results in Block Q and Block P being placed in different block populations than Block M and Block K, respectively. Block M and Block Q are both associated with thermal region 3, but the thermal region tag for Block Q is further indicative of additional read verification to perform on blocks that it is associated with. Because Block Q is the first block closed in thermal region 3 after the cross-temperature event to thermal region 5, a BER test may be performed on Block Q and read parameters for Block Q may be set accordingly. A similar process is invoked for Block P for thermal region 4.

Another cross-temperature event into thermal region 0 occurs while programming Block B and Block C. This is an extreme cross-temperature event that triggers another separation of block populations. Thus, Block D will be associated with a thermal region tag for thermal region 3, but marked separate from the populations for Block M or Block Q. Because the cross-temperature event was an extreme cross-temperature event, Block D may be marked for priority relocation, or associated with a thermal outlier block region, such as thermal region 0 or thermal region 6.

Figure 5:
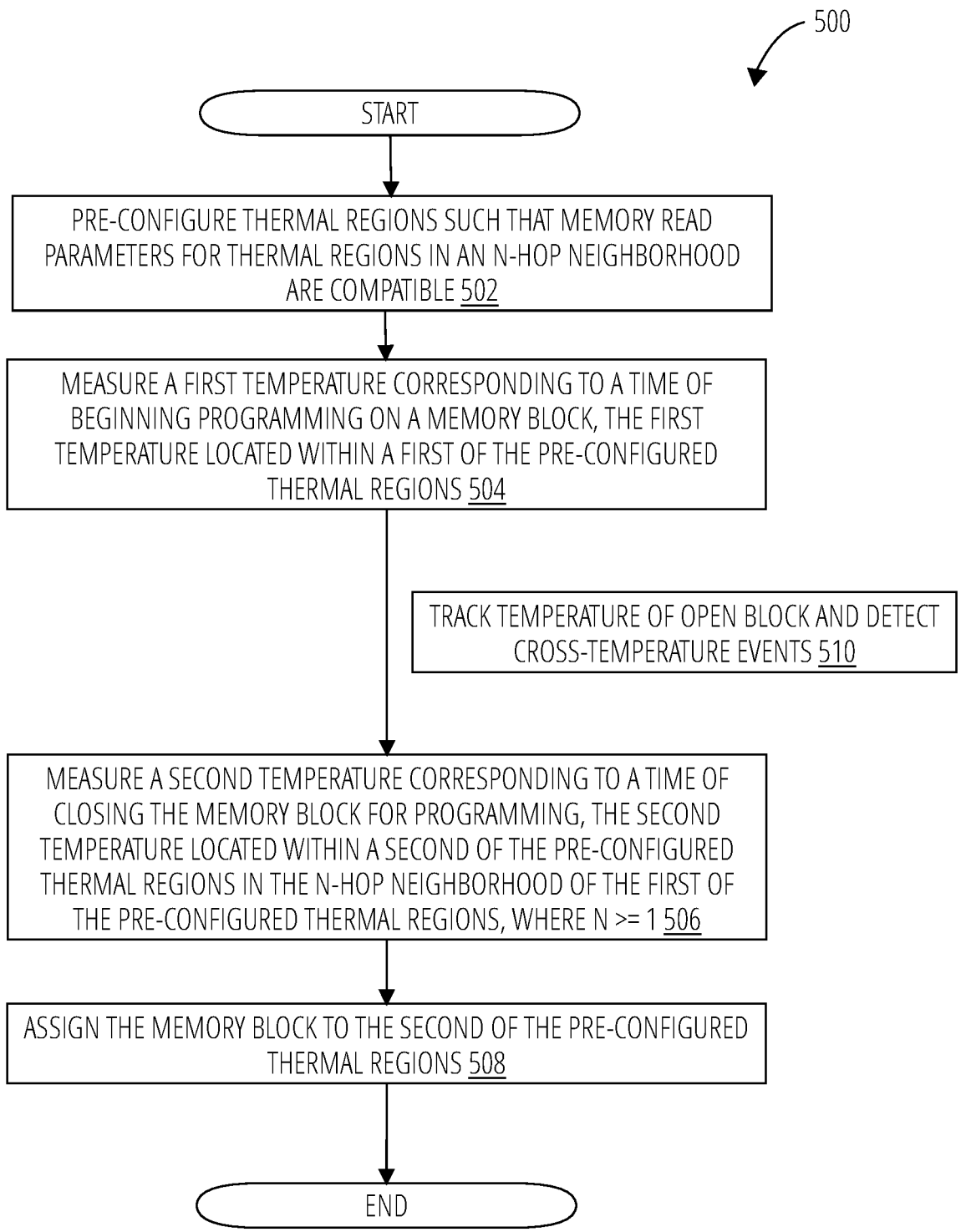
FIG. 5 depicts a block tagging routine 500 in accordance with one embodiment.

FIG. 5 depicts a block tagging routine 500 in one embodiment. The block tagging routine 500 may be used to improve read performance in operating environments with frequently changing device temperature conditions. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order. The actions depicted may be carried out for example by the storage controller 104 and/or die controller 202 first introduced in FIG. 1 and FIG. 2.

At block 502, thermal regions may be pre-configured such that memory read parameters for pre-configured thermal regions in an N-hop neighborhood are compatible. This action may result in thermal region compatibility within the N-hop neighborhood. Compatible read parameters are read parameters that are not incompatible read parameters. "Incompatible read parameters" refers to memory read parameters, such as threshold voltages, that cannot reliably be applied across blocks closed in different thermal regions or blocks closed in the same thermal region on different sides of a cross-temperature event that can degrade or change read parameters.

At block 504, a first temperature corresponding to a time of beginning programming on a memory block may be measured. The first temperature may be located within a first of the pre-configured thermal regions.

At block 506, a second temperature may be measured corresponding to a time of closing the memory block for programming. The second temperature may be located within a second of the pre-configured thermal regions in the N-hop neighborhood of the first of the pre-configured thermal regions, where $N \geq 1$. At block 508, the memory block may be assigned to the second of the pre-configured thermal regions.

Temperature tracking may also be performed on the block while it is open for programming (block 510). The temperature tracking may be used to detect cross-temperature events that occur while the block is open and determine if the block is a thermal outlier block.

Figure 6A:
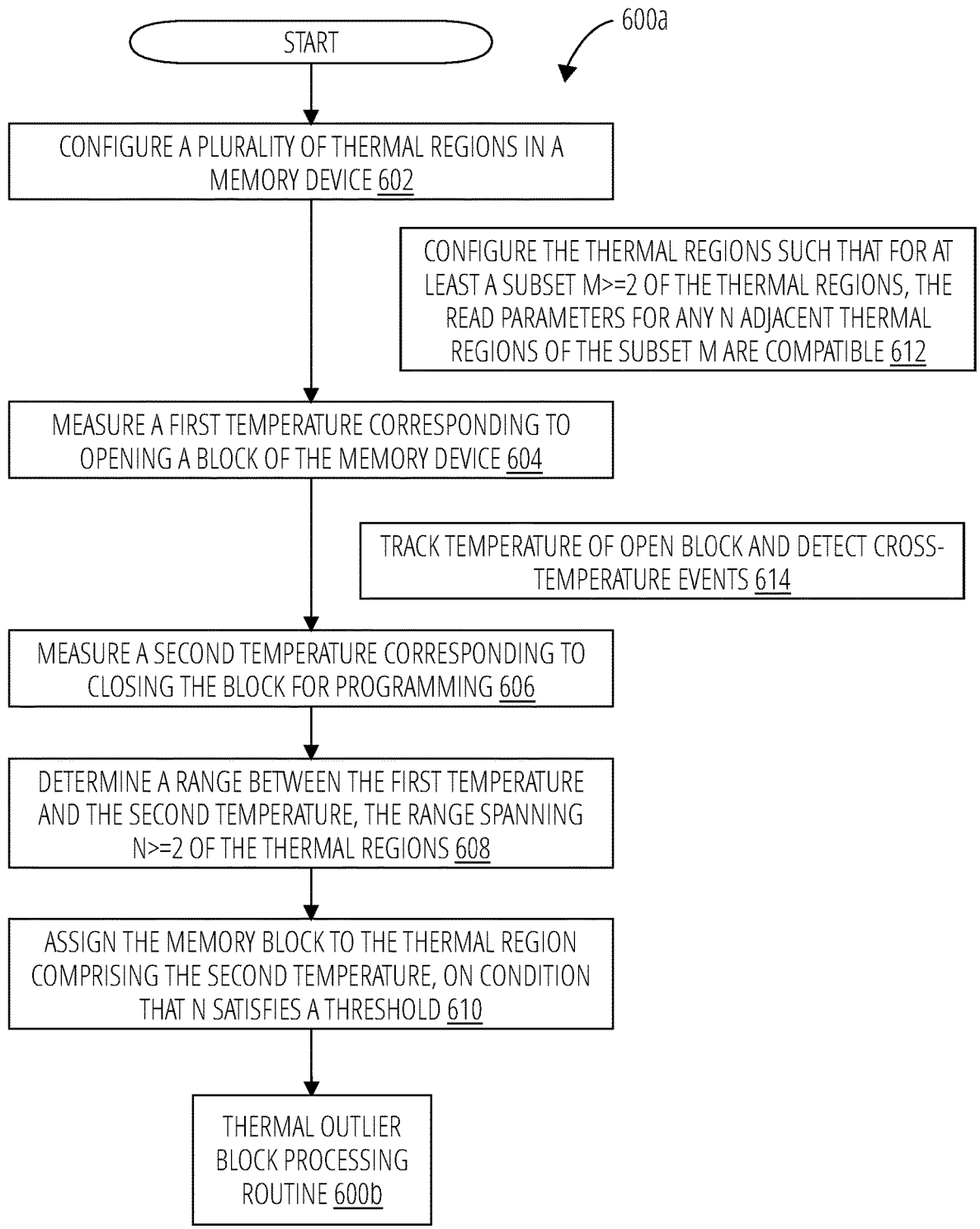
FIG. 6A depicts a block tagging routine 600a in accordance with one embodiment.

FIG. 6A depicts a block tagging routine 600a in one embodiment. The block tagging routine 600a may be used in conjunction with thermal outlier block processing routine 600b, described in FIG. 6B, to configure thermal regions, assign memory blocks to the thermal regions, and apply read parameters associated with thermal regions to storage blocks assigned therein. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order. The actions depicted may be carried out for example by the storage controller 104 and/or die controller 202 first introduced in FIG. 1 and FIG. 2.

At block 602 a plurality of thermal regions may be configured in a memory device. This action results in a set of thermal regions that may be used in later steps of block tagging routine 600a and thermal outlier block processing routine 600b. Per block 612, the thermal regions may be configured such that, for at least a subset $M \geq 2$ of the thermal regions, the read parameters for any N adjacent thermal regions of the subset M are compatible.

At block 604, a first temperature corresponding to opening a block of the memory device may be measured. This action results in a first temperature for use in later steps of block tagging routine 600a and thermal outlier block processing routine 600b.

At block 606, a second temperature corresponding to closing the block for programming may be measured. This action results in a second temperature for use in later steps of block tagging routine 600a and thermal outlier block processing routine 600b.

While the block is open for programming, the system may track its temperature (e.g., with temperature measurements at periodic intervals) (block 614). These measurements may be used to determine whether cross-temperature events occur on the block, and if so, the temperature range of the cross-temperature event(s) and their frequency.

At block 608, the first temperature from block 604 and second temperature from block 606 may be used to determine a temperature range between the first and second temperatures. The range may span $N \geq 2$ of the thermal regions.

At block 610, the memory block for which temperature is measured in block 604 and block 606 may be assigned to the thermal region configured in block 602 and including the second temperature of block 606, on condition that N satisfies a threshold. The steps of thermal outlier block processing routine 600b may follow from block 610.

Figure 6B:
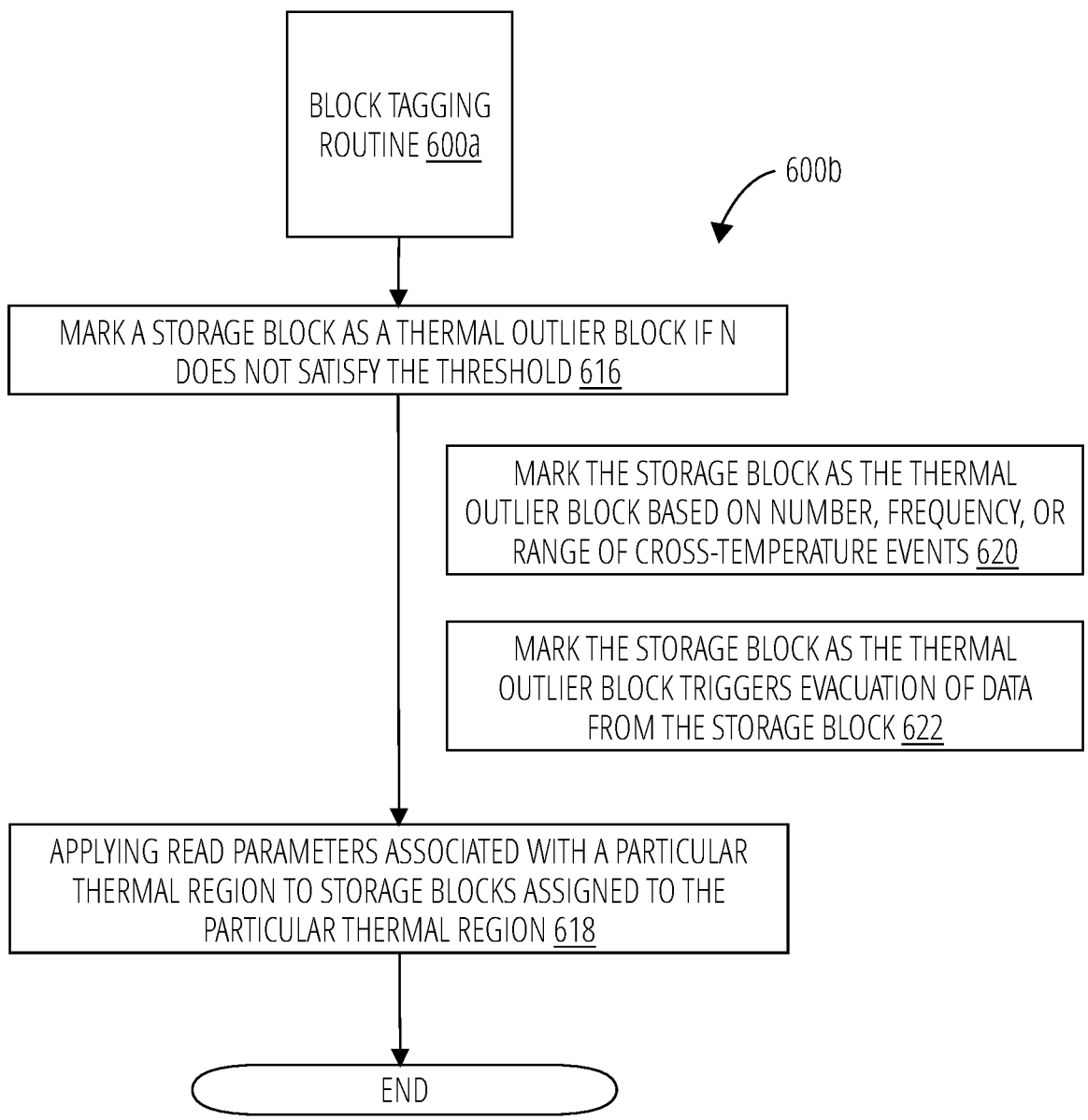
FIG. 6B depicts a thermal outlier block processing routine 600b in accordance with one embodiment.

FIG. 6B depicts a thermal outlier block processing routine 600b in one embodiment. The thermal outlier block processing routine 600b may be used in conjunction with block tagging routine 600a, described in FIG. 6A, to configure thermal regions, assign memory blocks to the thermal regions, and apply read parameters associated with thermal regions to storage blocks assigned therein. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order. The actions depicted may be carried out for example by the storage controller 104 and/or die controller 202 first introduced in FIG. 1 and FIG. 2.

Thermal outlier block processing routine 600b picks up from block tagging routine 600a at block 616. At block 616, storage block may be marked as a thermal outlier block if N does not satisfy the threshold from block 610. A block may also be marked as a thermal outlier block if a range, number, or frequency, or combination thereof, of cross-temperature events experienced by the block does not satisfy a condition or threshold (block 620). This may result in the evacuation of data in block 622. Per block 622, marking the storage block as the thermal outlier block may trigger evacuation of data from the storage block.

At block 618, read parameters associated with a particular thermal region in block 612, introduced in FIG. 6A, may be applied to storage blocks assigned to that particular thermal region.

Figure 7:
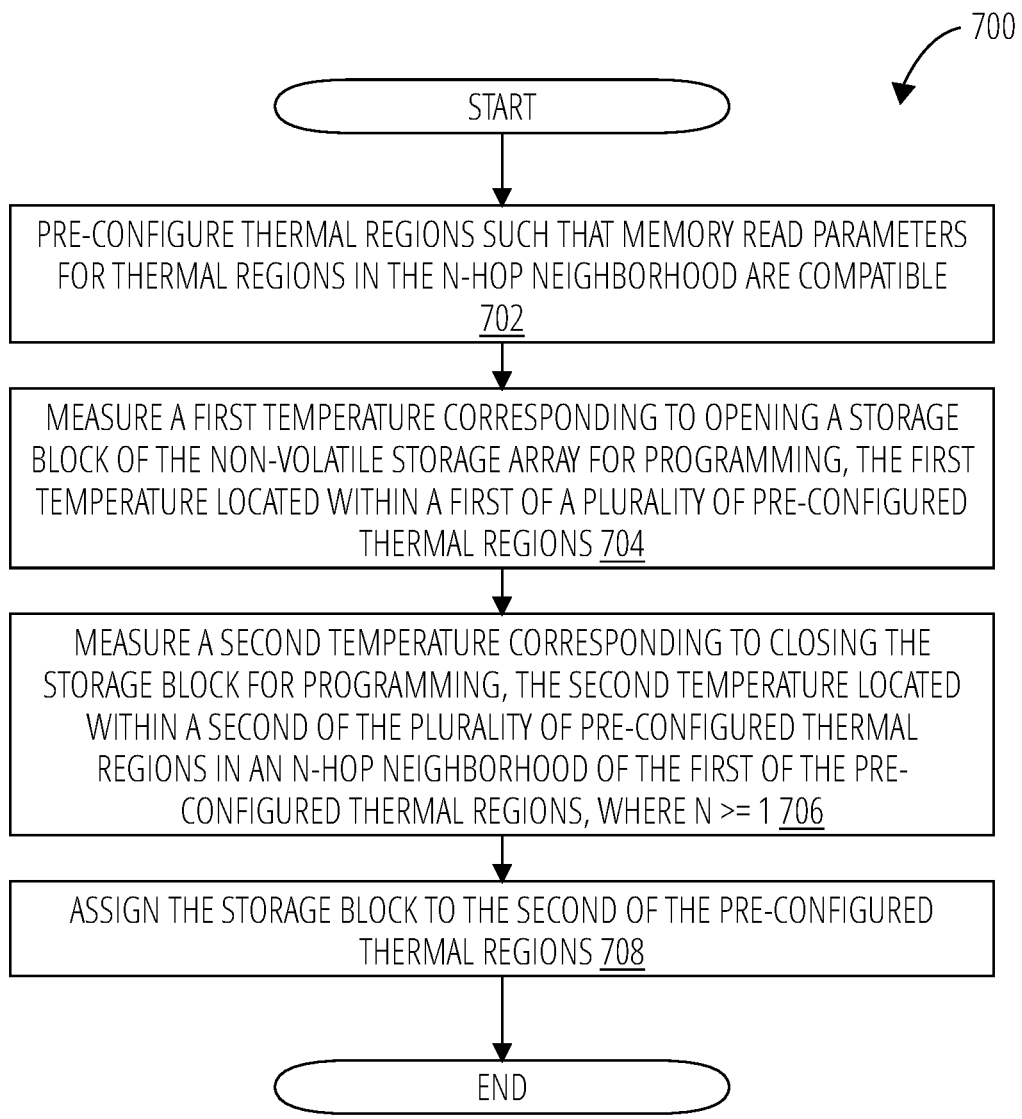
FIG. 7 depicts a block tagging routine 700 in accordance with one embodiment.

FIG. 7 depicts a block tagging routine 700 in one embodiment. The block tagging routine 700 may be used to preconfigure thermal regions that are compatible within an N-hop neighborhood and assign storage blocks to appropriate thermal regions. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order. The actions depicted may be carried out for example by the storage controller 104 and/or die controller 202 first introduced in FIG. 1 and FIG. 2.

At block 702, thermal regions may be pre-configured such that memory read parameters for pre-configured thermal regions in the N-hop neighborhood are compatible. This action results in compatible sets of thermal regions within an N-hop neighborhood. All N-hop neighborhoods of the pre-configured thermal regions may be compatible, or only a subset M of the pre-configured thermal regions may be compatible.

At block 704, a first temperature corresponding to opening a storage block of the non-volatile storage array for programming is measured. The first temperature may be located within a first of a plurality of pre-configured thermal regions.

At block 706, a second temperature corresponding to closing the storage block for programming may be measured. The second temperature may be located within a second of the plurality of pre-configured thermal regions in an N-hop neighborhood of the first of the pre-configured thermal regions, where $N \geq 1$.

At block 708, the storage block may be assigned to the second of the pre-configured thermal regions, based on the second temperature measured in block 706.

Figure 8:
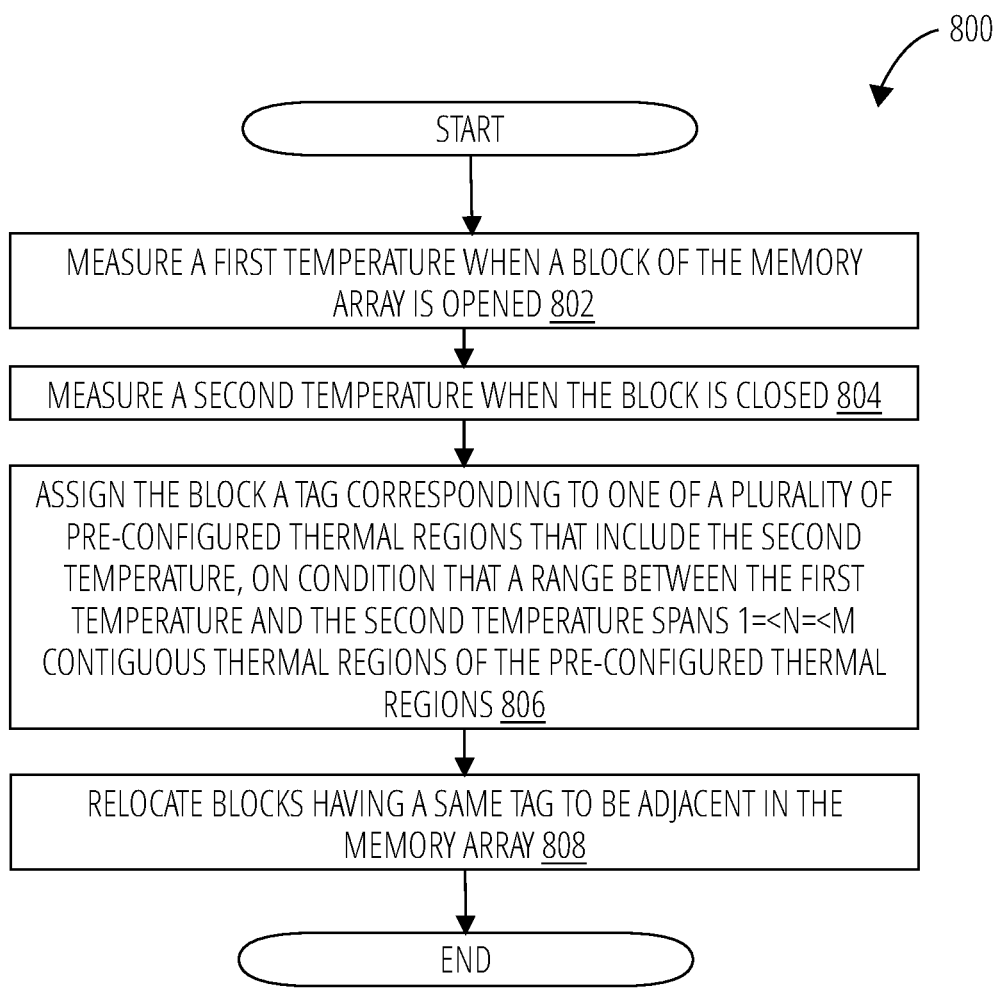
FIG. 8 depicts a block relocation routine 800 in accordance with one embodiment.

FIG. 8 depicts a block relocation routine 800 in one embodiment. The block relocation routine 800 may be used to relocate storage blocks based on thermal region tags. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order. The actions depicted may be carried out for example by the storage controller 104 and/or die controller 202 first introduced in FIG. 1 and FIG. 2.

At block 802, a first temperature may be measured when a block of the memory array is opened. This first temperature may be used in later steps of the block relocation routine 800.

At block 804, a second temperature may be measured when a block of the memory array is closed. This second temperature may be used in later steps of the block relocation routine 800.

At block 806, the block may be assigned a tag corresponding to one of a plurality of pre-configured thermal regions including the second temperature from block 804. The tag may be assigned thus on condition that a range between the first temperature from block 802 and the second temperature from block 804 spans $1 \leq N \leq M$ contiguous thermal regions of the pre-configured thermal regions.

At block 808, blocks including the same tag may be relocated so as to be adjacent in the memory array.

Figure 9A:
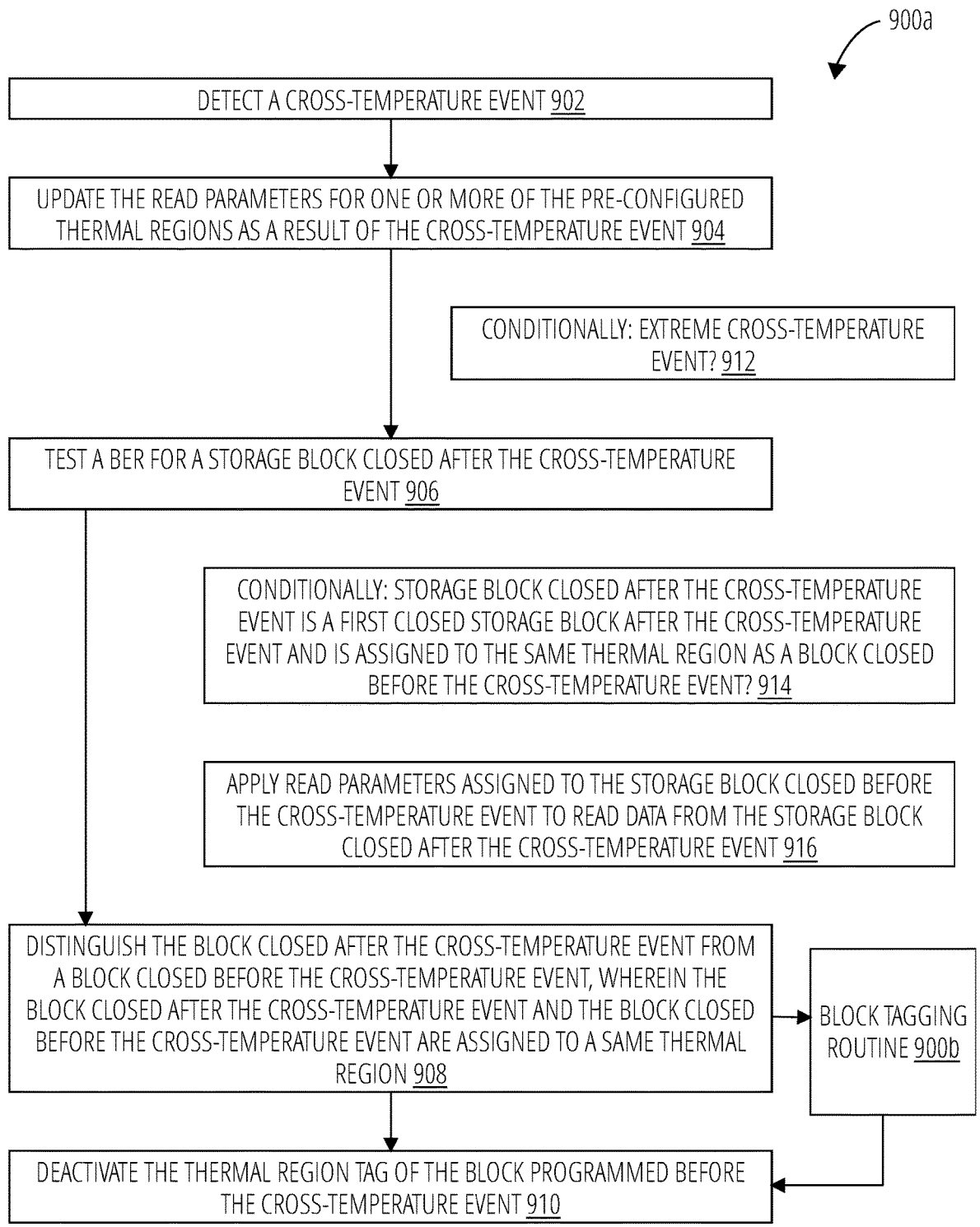
FIG. 9A depicts a block tagging routine 900a in accordance with one embodiment.

FIG. 9A depicts a block tagging routine 900a in one embodiment. The block tagging routine 900a may be used in conjunction with the block tagging routine 900b of FIG. 9B to assign thermal region tags and read parameters based on BER and cross-temperature events. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order. The actions depicted may be carried out for example by the storage controller 104 and/or die controller 202 first introduced in FIG. 1 and FIG. 2.

At block 902, a cross-temperature event may be detected. The cross-temperature event detected through the action at block 902 may act as the trigger for beginning block tagging routine 900a.

At block 904, the read parameters for one or more of the pre-configured thermal regions may be updated as a result of the cross-temperature event detected in block 902. In some embodiments, per block 912, step block 904 may be condition upon the cross-temperature event being an extreme cross-temperature event.

At block 906, a BER may be tested for the storage block closed after the cross-temperature event detected in block 902. In one embodiment, as described in block 914, the BER may be tested if the storage block closed after the cross-temperature event is the first storage block closed after the cross-temperature event, and if that storage block is assigned to the same thermal region as a block closed before the cross-temperature event. At block 916, in one embodiment, read parameters assigned to the storage block closed before the cross-temperature event may be applied to read data from the storage block closed after the cross-temperature event.

At block 908, the block closed after the cross-temperature event from block 906 may be distinguished from a block closed before the cross-temperature event. The block closed after the cross-temperature event and the block closed before the cross-temperature event may be assigned to the same thermal region.

Additional steps discussed with regard to block tagging routine 900b may be carried out subsequent to block 908 in one embodiment and may then return to block 910. At block 910, the thermal region tag of the block programmed before the cross-temperature event may be deactivated.

Figure 9B:
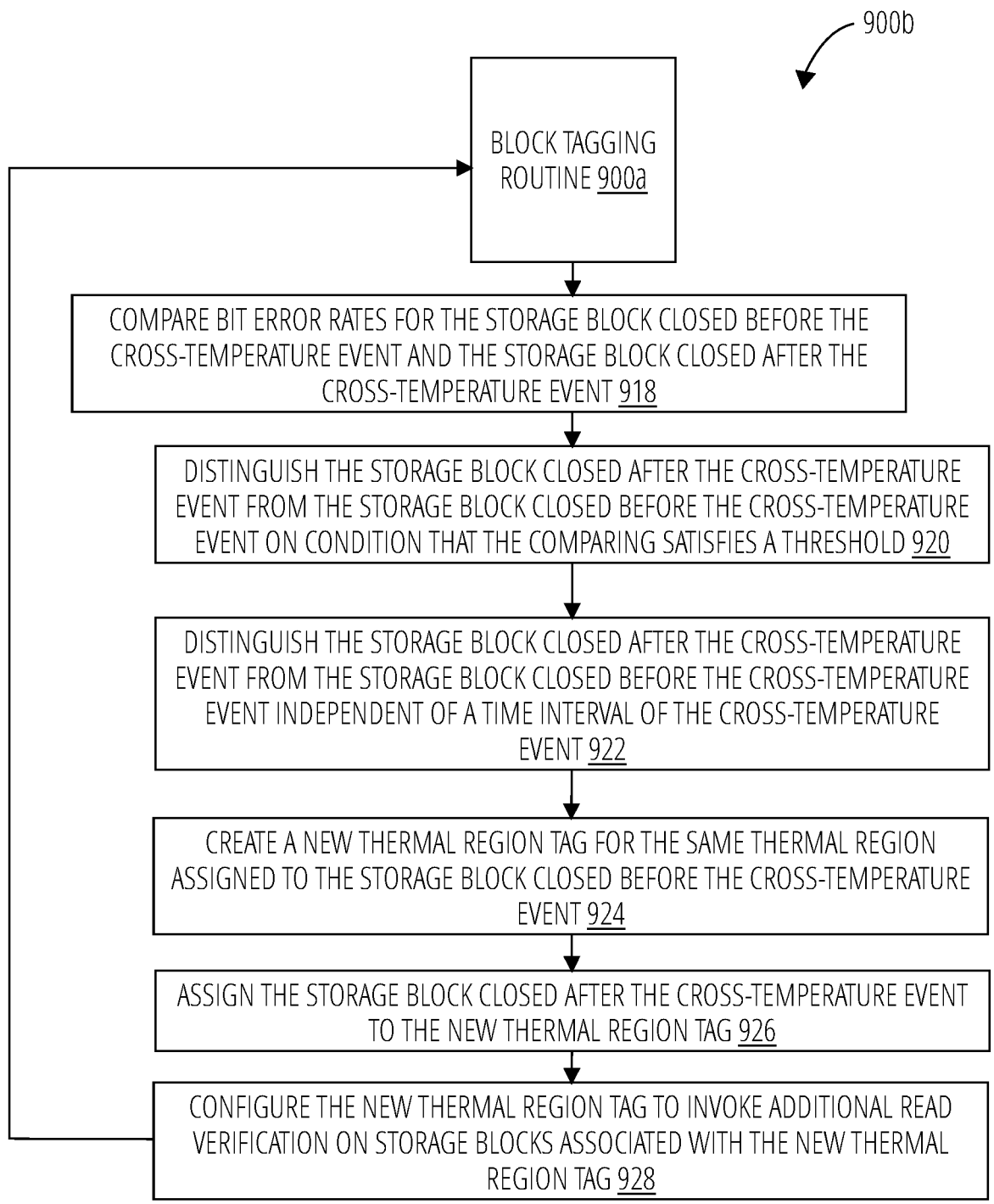
FIG. 9B depicts a block tagging routine 900b in accordance with one embodiment.

FIG. 9B depicts a block tagging routine 900b in one embodiment. The block tagging routine 900b may be used in conjunction with the block tagging routine 900a of FIG. 9A to create and assign new thermal region tags to invoke additional read verification for some storage blocks. The actions depicted should not be presumed to occur in the order presented, unless an action depends on the result of a previous action to be carried out. If two or more actions are not conditioned on one another in some way, one skilled in the art will readily ascertain that they may be carried out in parallel, in a time-division fashion, or in a different order. The actions depicted may be carried out for example by the storage controller 104 and/or die controller 202 first introduced in FIG. 1 and FIG. 2.

Thermal outlier block processing routine 600b picks up from block tagging routine 900a at block 918, where BERs may be compared for the storage blocks closed before and after the cross-temperature event. This comparison may allow the blocks to be differentiated in the steps that follow.

A number of additional actions may take place after or involving the BER comparison of block 918. These additional actions may not necessarily occur in a particular order unless an implicit order is indicated by cause and effect.

At block 920, the storage block closed after the cross-temperature event may be distinguished from the storage block closed before the cross-temperature event if the BER comparison of block 918 satisfies a threshold voltage. This distinction may result in block assignments as described in later steps of block tagging routine 900b.

At block 922, the storage block closed after the cross-temperature event may be distinguished from the storage block closed before the cross-temperature event independent of a time interval of the cross-temperature event. This distinction may result in block assignments as described in later steps of block tagging routine 900b.

At block 924, a new thermal region tag may be created including the same thermal region assigned to the storage block closed before the cross-temperature event. This tag may be applied to storage blocks in order to assign them to thermal regions, such as in block 926.

At block 926, the storage block closed after the cross-temperature event may be assigned the new thermal region tag created in block 924. This assignment may be used to differentiate the storage block during future storage operations.

At block 928, the new thermal region tag created in block 924 may be configured to invoke additional read verification on storage blocks associated with it. Configuring the thermal region tag in this manner may result in improved performance by more quickly identifying storage blocks that may incur data loss due to cross-temperature events. Once block 928 is completed, the block tagging routine 900b may return to the steps of block tagging routine 900a as described in FIG. 9A.

Those of ordinary skill in the art will appreciate that the techniques disclosed herein, and variations thereof may be performed by various forms of logic as suited to the particulars of the implementation.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processors" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc., are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

What is claimed is:

1. A method, comprising:
measuring a first temperature corresponding to opening a storage block of the memory device for programming;
measuring a second temperature corresponding to closing the storage block for programming;
determining a range between the first temperature and the second temperature, the range spanning N≥2 pre-configured thermal regions; and assigning the storage block to a thermal region that includes the second temperature, on condition that N satisfies a threshold.

2. The method of claim 1, further comprising:
marking the storage block as a thermal outlier block if N does not satisfy the threshold.

3. The method of claim 2, wherein marking the storage block as the thermal outlier block triggers evacuation of data from the storage block.

4. The method of claim 1, further comprising:
tracking a temperature of the block while the block is open for programming;
determining one or more of a number of cross-temperature events, a temperature range of one or more cross-temperature event, and a frequency of cross-temperature events; and
marking the storage block as a thermal outlier block conditionally based on one or more of the number of cross-temperature events, the temperature range of one or more cross-temperature event, and the frequency of cross-temperature events.

5. The method of claim 1, wherein read parameters to apply to storage blocks assigned to a particular thermal region are applied particularly to blocks assigned to the particular thermal region.

6. The method of claim 5, wherein the thermal regions are configured such that for at least a subset M≥2 of the thermal regions, the read parameters for any N adjacent thermal regions of the subset M are compatible.

7. A device, comprising:
a non-volatile memory array;
a controller; and
first logic to configure the controller to:
measure a first temperature corresponding to opening a storage block of the non-volatile memory array for programming, the first temperature located within a first of a plurality of pre-configured thermal regions;
measure a second temperature corresponding to closing the storage block for programming, the second temperature located within a second of the plurality of pre-configured thermal regions in an N-hop neighborhood of the first of the pre-configured thermal regions, where N≥1; and
assign the storage block to the second of the pre-configured thermal regions;
wherein the plurality of pre-configured thermal regions are configured such that memory read parameters for thermal regions in the N-hop neighborhood are compatible.

8. The device of claim 7, further comprising second logic to:
detect a cross-temperature event; and
update the read parameters for one or more of the pre-configured thermal regions as a result of the cross-temperature event.

9. The device of claim 8, wherein the update of the read parameters is conditioned on the cross-temperature event being an extreme cross-temperature event.

10. The device of claim 7, further comprising third logic to:
detect a cross-temperature event;
test a bit error rate for a storage block closed after the cross-temperature event; and
distinguish the storage block closed after the cross-temperature event from a storage block closed before the cross-temperature event, wherein the storage block closed after the cross-temperature event and the storage block closed before the cross-temperature event are assigned to a same thermal region.

11. The device of claim 10, wherein the bit error rate test is performed on condition that the storage block closed after the cross-temperature event is a first closed storage block, after the cross-temperature event, and the storage block closed after the cross-temperature event is assigned to the same thermal region as the storage block closed before the cross-temperature event.

12. The device of claim 10, wherein distinguishing the storage block closed after the cross-temperature event from the storage block closed before the cross-temperature event comprises:
creating a new thermal region tag including the same thermal region assigned to the storage block closed before the cross-temperature event;
assigning the storage block closed after the cross-temperature event to the new thermal region tag; and
marking the new thermal region tag to invoke additional read verification on storage blocks associated with the new thermal region tag.

13. The device of claim 10, further comprising fourth logic to:
deactivate the thermal region tag of the block programmed before the cross-temperature event, such that storage blocks closed after the cross-temperature event cannot be assigned to the thermal region tag of the storage block closed before the cross-temperature event.

14. The device of claim 10, wherein the bit error rate test and distinguishing comprise:
applying read parameters assigned to the storage block closed before the cross-temperature event to read data from the storage block closed after the cross-temperature event;
comparing bit error rates for the storage block closed before the cross-temperature event and the storage block closed after the cross-temperature event; and
distinguishing the storage block closed after the cross-temperature event from the storage block closed before the cross-temperature event on condition that the comparing satisfies a threshold.

15. The device of claim 10, wherein distinguishing the storage block closed after the cross-temperature event from the storage block closed before the cross-temperature event is independent of a time interval of the cross-temperature event.

16. A system, comprising:
a memory array; and
a controller configured to:
measure a first temperature when a block of the memory array is opened;
measure a second temperature when the block is closed;
assign the block a tag corresponding to one of a plurality of pre-configured thermal regions including the second temperature, on condition that a range between the first temperature and the second temperature spans 1≤N≤M contiguous thermal regions of the pre-configured thermal regions; and
relocate blocks having a same tag to be adjacent in the memory array.

17. The system of claim 16, the controller further configured to:
mark blocks for which the range between the first temperature and the second temperature spans more than M contiguous thermal regions as thermal outlier blocks.

18. The system of claim 17, the controller further configured to:
- marking the storage block as a thermal outlier block conditionally based on one or more of a number of cross-temperature events, a temperature range of one or more cross-temperature event, and a frequency of cross-temperature events while the block is open for programming.

19. The system of claim 16, the controller further configured to:
- detect an extreme cross-temperature event;
- distinguish blocks closed after the extreme cross-temperature event and assigned a particular tag from blocks closed before the extreme cross-temperature event having the particular tag; and
- relocate the blocks having the particular tag and closed after the extreme cross-temperature event to be adjacent in the memory array distinct from the blocks having the particular tag and closed before the extreme cross-temperature event.

20. The system of claim 19, the controller further configured to:
- distinguish the blocks closed before the extreme cross-temperature event from the blocks closed after the extreme cross-temperature event on condition that a bit error rate for a first of the blocks closed after the extreme cross-temperature event compares unfavorably to a bit error rate for one of the blocks closed before the extreme cross-temperature event.

\* \* \* \* \*